(12) United States Patent
Takamine et al.

(10) Patent No.: US 6,882,249 B2
(45) Date of Patent: Apr. 19, 2005

(54) SURFACE ACOUSTIC WAVE DEVICE

(75) Inventors: Yuichi Takamine, Kanazawa (JP); Kazunobu Shimoe, Kanazawa (JP); Shigeto Taga, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 130 days.

(21) Appl. No.: 09/883,481

(22) Filed: Jun. 18, 2001

(65) Prior Publication Data

US 2001/0043024 A1 Nov. 22, 2001

(30) Foreign Application Priority Data

Jun. 27, 2000 (JP) .......................................... 2000-193295
Apr. 13, 2001 (JP) .......................................... 2000-115642

(51) Int. Cl.[7] .................................................. H03H 9/64
(52) U.S. Cl. .................... 333/193; 333/195; 310/313 B
(58) Field of Search ................................. 333/193–196; 310/313 B, 313 D

(56) References Cited

U.S. PATENT DOCUMENTS 5,790,000 A * 8/1998 Dai et al. ..................... 333/193
5,821,834 A * 10/1998 Xu et al. ...................... 333/193
5,847,626 A * 12/1998 Taguchi et al. .............. 333/193
5,874,869 A * 2/1999 Ueda et al. .................. 333/193
5,994,980 A * 11/1999 Tada ........................... 333/193
6,339,365 B1 * 1/2002 Kawase et al. .............. 333/193
6,388,545 B1 * 5/2002 Kawachi et al. ............. 333/193

FOREIGN PATENT DOCUMENTS

CN          85101813 A    1/1987
CN           1112749 A    11/1995
CN           1165431 A    11/1997

* cited by examiner

Primary Examiner—Barbara Summons
(74) Attorney, Agent, or Firm—Keating & Bennett, LLP

(57) ABSTRACT

A surface acoustic wave device includes a piezoelectric substrate, at least one IDT disposed on the piezoelectric substrate, and an input end and an output end connected to the IDT. At least one of the input end and the output end includes a pair of balanced signal terminals, and a delay line or a reactance component connected to one of the pair of balanced signal terminals.

21 Claims, 21 Drawing Sheets

SURFACE ACOUSTIC WAVE DEVICE

BACKGROUND OF THE INVENTION

1. Field of the Invention

The present invention relates to a surface acoustic wave device used as, for example, a bandpass filter, and more particularly, the present invention relates to a surface acoustic wave device in which an input end and/or an output end includes a pair of balanced signal terminals.

2. Description of the Related Art

In recent years, portable telephones have become smaller and lighter. In order to satisfy these demands, the reduction in the number of component parts, the miniaturization of parts, and the combination of functions must be achieved.

Considering the above circumstances, various surface acoustic wave filters having the function of balanced-to-unbalanced conversion or the function of a balun element, which are used in the RF stage of the portable telephone, have been proposed.

FIG. 30 is a schematic plan view showing the electrode construction of a conventional surface acoustic wave filter having the function of balanced-to-unbalanced conversion.

Here, first to third IDTs 101 to 103 are disposed along the surface acoustic wave propagation direction. Reflectors 104 and 105 are disposed on both sides of the area having the IDTs 101 to 103 provided therein in the surface wave propagation direction. Both the distance between the IDT 101 and the IDT 102 and the distance between the IDT 102 and the IDT 103 are 0.75 λI when a wavelength determined by the pitch of electrode fingers of the IDTs 101 to 103 is λI. The free area between IDTs is made small by thickening the electrode fingers 109 and 110 at both ends of the IDT 102. As a result, the loss caused by the radiation of a bulk acoustic wave is reduced. Moreover, in FIG. 30, terminals 106 and 107 are balanced signal terminals and a terminal 108 is an unbalanced signal terminal.

In the surface acoustic wave filter having the function of balanced-to-unbalanced conversion, the transmission characteristic in each of the passbands between the unbalanced signal terminal 108 and the balanced signal terminal 106 and between the unbalanced signal terminal 108 and the balanced signal terminal 107 is required to be equal in amplitude characteristic and 180 degrees opposite in phase. The condition of being equal in amplitude characteristic is called an amplitude balance and the condition of being 180 degrees different in phase is called a phase balance.

The above-mentioned amplitude balance and phase balance are defined as in the following, when a surface acoustic wave filter having the function of balanced-to-unbalanced conversion is considered to be a three-port device, for example, assuming that the unbalanced input end is port 1 and that the balanced output ends are port 2 and port 3, respectively.

Amplitude balance=|A| where A=|20 log S21|-|20 log S31|.

Phase balance=|B-180| where B=|∠S21-∠S31|.

Moreover, S21 represents a transfer factor to port 2 from port 1 and S31 represents a transfer factor to port 3 from port 1.

Ideally, it is required that the amplitude balance is 0 dB and the phase balance is 0 dB in the passband of a filter.

However, in the construction shown in FIG. 30, when a filter having the function of balanced-to-unbalanced conversion was attempted to be produced, there was a problem in that the balance becomes worse because the number of electrode fingers of the IDT 102 is odd and the number of electrode fingers connected to the balanced signal terminal 106 is greater by one than the number of electrode fingers connected to the balanced signal terminal 107. This problem particularly becomes apparent as the center frequency of the filter increases, and in the filters the center frequency of which is about 1.9 GHz as in the filters for DCS and PCS, adequate balances can not be obtained.

SUMMARY OF THE INVENTION

In order to overcome the problems described above, preferred embodiments of the present invention provide a surface acoustic wave device in which the above-mentioned problems are solved and the balance between a pair of balanced signal terminals is greatly improved.

A surface acoustic wave device according to a first preferred embodiment of the present invention includes a piezoelectric substrate, at least one IDT disposed on the piezoelectric substrate, and an input end and an output end connected to the IDT. At least one of the input end and the output end includes a pair of balanced signal terminals, and a delay line or a reactance component is connected to one of the pair of balanced signal terminals. Therefore, by adding a reactance component or a delay line in accordance with the difference between the frequency characteristics of the first and second balanced signal terminals, the balance such as the amplitude balance, phase balance, and other characteristics, can be effectively improved.

A surface acoustic wave device according to a second preferred embodiment of the present invention includes a piezoelectric substrate, at least one IDT disposed on the piezoelectric substrate, and an input end and an output end connected to the IDT. At least one of the input end and the output end includes a pair of balanced signal terminals, and delay lines or reactance components are connected to the pair of balanced signal terminals, respectively, and are different from each other. According to this unique structure, by making the reactance components or the delay lines different from each other in accordance with the difference between the frequency characteristics of the first and second balanced signal terminals, the amplitude balance and phase balance can be effectively improved in the same way as in the first preferred embodiment of the present invention.

A surface acoustic wave device according to a third preferred embodiment of the present invention includes a piezoelectric substrate, at least one IDT disposed on the piezoelectric substrate, and an input end and an output end connected to the IDT. At least one of the input end and the output end comprises a pair of balanced signal terminals, and a capacitance component is connected between the pair of balanced signal terminals. According to this unique structure, the capacitance connected between the pair of balanced signal terminals can adjust the deviation of the frequency characteristics between the pair of balanced signal terminals, thereby improving the amplitude balance and the phase balance effectively.

The aforementioned surface acoustic wave devices according to various preferred embodiments of the present invention may define a longitudinally coupled resonator type surface acoustic wave filter in which at least three IDTs are disposed along the surface acoustic wave propagation direction. In this case, a longitudinally coupled resonator type surface acoustic wave filter in which the amplitude balance and the phase balance are improved according to preferred embodiments of the present invention can be obtained. Also, a plurality of longitudinally coupled resonator type surface acoustic wave filters may be connected to each other in a cascade arrangement.

An electrical neutral point may be provided between the pair of balanced signal terminals but, it is preferable there is no electrically neutral point between the balanced signal terminals. In either case, a surface acoustic wave device in which the amplitude balance and the phase balance are improved can be constructed according to other preferred embodiments of the present invention.

A piezoelectric substrate may be housed in a package in which microstrip lines are formed. Furthermore, the microstrip lines may constitute the above-mentioned reactance components or delay lines such that a surface acoustic wave device according to various preferred embodiments of the present invention can be easily constructed only by forming microstrip lines to define the reactance components or delay lines on the side of the package.

Furthermore, when the above-mentioned reactance components are constructed using microstrip lines or delay lines, as the microstrip lines are constructed inside the package, the balance can be improved without increasing the mounting area of a surface acoustic wave device.

When a surface acoustic wave element in which IDTs are provided on a piezoelectric substrate is housed with the surface with the IDTs disposed thereon face down in a package, a surface acoustic wave device having a very small size and an excellent balance can be provided according to another preferred embodiment of the present invention.

When a surface acoustic wave element with IDTs constructed on a piezoelectric substrate is housed in a package having electrodes disposed thereon, and the electrodes of the package are electrically connected to the surface acoustic wave element by bonding wires, the level of the above-mentioned reactance components or delay lines can be adjusted by adjusting the length of the bonding wires connected to a pair of balanced signal terminals. As a result, a surface acoustic wave device in which the balance is improved according to preferred embodiments of the present invention can be easily provided.

When the above-mentioned reactance components and delay lines dependent on the length of bonding wires is added, because the dimension of the package is not required to change, the balance can be improved without increasing the mounting space required.

In a communication device including a surface acoustic wave device according to above-described preferred embodiments of the present invention, since the balance between a pair of balanced signal terminals is greatly improved, a communication device in which the balance in frequency characteristic is excellent can be constructed.

Other features, elements, characteristics and advantages of the present invention will become more apparent from the following detailed description of preferred embodiments with reference to the attached drawings.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the present invention is made clear by describing specific preferred embodiments of the present invention with reference to the drawings.

A surface acoustic wave device according to a first preferred embodiment of the present invention is described with reference to FIGS. 1 to 4. Moreover, in the present preferred embodiment and the following preferred embodiments, a surface acoustic wave device to be applied to an AMPS reception filter is taken as an example and described.

Figure 1:
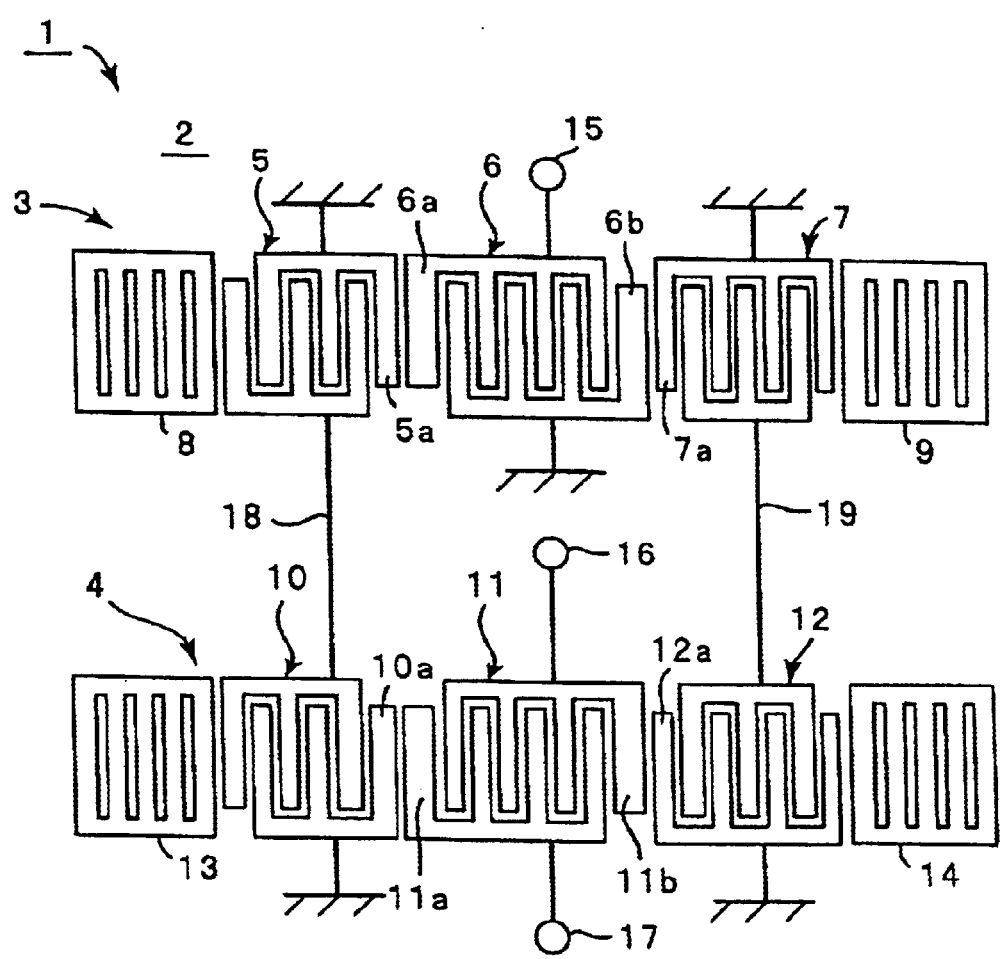
FIG. 1 is a schematic plan view showing the electrode construction of a surface acoustic wave device according to a first preferred embodiment of the present invention.

In the present preferred embodiment, a surface acoustic wave device 1 preferably includes an electrode construction shown in FIG. 1 on a piezoelectric substrate 2 preferably defined by a 40±5° Y cut X propagation LiTaO$_3$ substrate.

In FIG. 1, first and second longitudinally coupled resonator type surface acoustic wave filters 3 and 4 are constructed on the piezoelectric substrate 2 in the surface acoustic wave device 1.

First to third IDTs 5 to 7 are arranged along the surface wave propagation direction in the longitudinally coupled resonator type surface acoustic wave filter 3. Reflectors 8 and 9 are arranged on both sides of an area in which the IDTs 5 to 7 are located. Also in the longitudinally coupled resonator type surface acoustic wave filter 4, first to third IDTs 10 to 12 are arranged along the surface wave propagation direction and reflectors 13 and 14 are arranged on both sides of an area in which the IDTs 10 to 12 are provided.

The longitudinally coupled resonator type surface acoustic wave filters 3 and 4 have the same construction and are connected in a cascade arrangement.

On end of the second IDT 6 of the longitudinally coupled resonator type surface acoustic wave filter 3 is connected to an unbalanced signal terminal 15. The other end of the IDT 6 is connected to the ground potential. Furthermore, one end of the IDTs 5 and 7 is connected to the ground potential and the other end of the IDTs 5 and 7 is connected to one end of the IDTs 10 and 12, respectively. The other end of the IDTs 10 and 12 is connected to the ground potential. On end of the IDT 11 is connected to a balanced signal terminal 16 and the other end is connected to a balanced signal terminal 17. In this way, the unbalanced signal terminal 15 and the pair of balanced signal terminals 16 and 17 respectively constitute an input end and an output end, or an output end and an input end.

The present preferred embodiment is constructed so that preferably there is no electrically neutral point between the balanced signal terminals 16 and 17.

Furthermore, the IDT 5 and the IDT 7 have opposite phases to each other and the IDTs 10 and 12 are opposite in phase to each other. Accordingly, the phase of a signal flowing the signal line 18 connecting the IDT 5 and the IDT 10 and the phase of a signal flowing the signal line 19 connecting the IDTs 7 and 12 are opposite in phase to each other.

An electrode finger 5a of IDT 5 and that is adjacent to the IDT 6, is connected to the ground potential. An electrode finger 7a of the IDT 7 and that is adjacent to the IDT 6 is connected to the ground potential. The electrode fingers 5a and 7a have the same polarity.

In the same way, both of an electrode finger 10a of the IDT 10 and adjacent to the second IDT 11, and an electrode finger 12a of the IDT 12 and adjacent to the IDT 11, are connected to the ground potential and have the same polarity.

An example of the specific design conditions of the surface acoustic wave device 1 are described in the following paragraphs.

Cross width of electrode fingers=49.0 λI

Number of electrode fingers of IDTs 5 and 10=24

Number of electrode fingers of IDTs 6 and 11=34

Number of electrode fingers of IDTs 7 and 12=25

Wavelength of IDT λI=4.49 μm

Wavelength of reflector λR=4.64 μm

Number of electrode fingers of reflector=120

Distance between IDTs=0.79 λI

Distance between IDT and reflector=0.47 λR

Moreover, the distance between IDTs and the distance between IDT and reflector are defined as the distance between the centers of the adjacent electrode fingers of adjacent IDTs and the distance between the centers of the electrode fingers adjacent to an IDT and a reflector, respectively.

Duty factor of IDT=0.73

Duty factor of reflector=0.55

However, the duty factor is defined as the ratio of the width of an electrode finger in the width direction of electrode fingers, that is, the width of an electrode finger, relative to the sum of the width of an electrode finger and the distance between electrode fingers in the surface wave propagation direction.

Film thickness of electrode finger: 0.08 λ

Moreover, as is clearly seen in FIG. 1, the width of the electrode fingers 6a, 6b, 11a, and 11b at both ends of the middle second IDTs 6 and 11 is larger and because of that, the free surface area between IDTs is made smaller.

Figure 2:
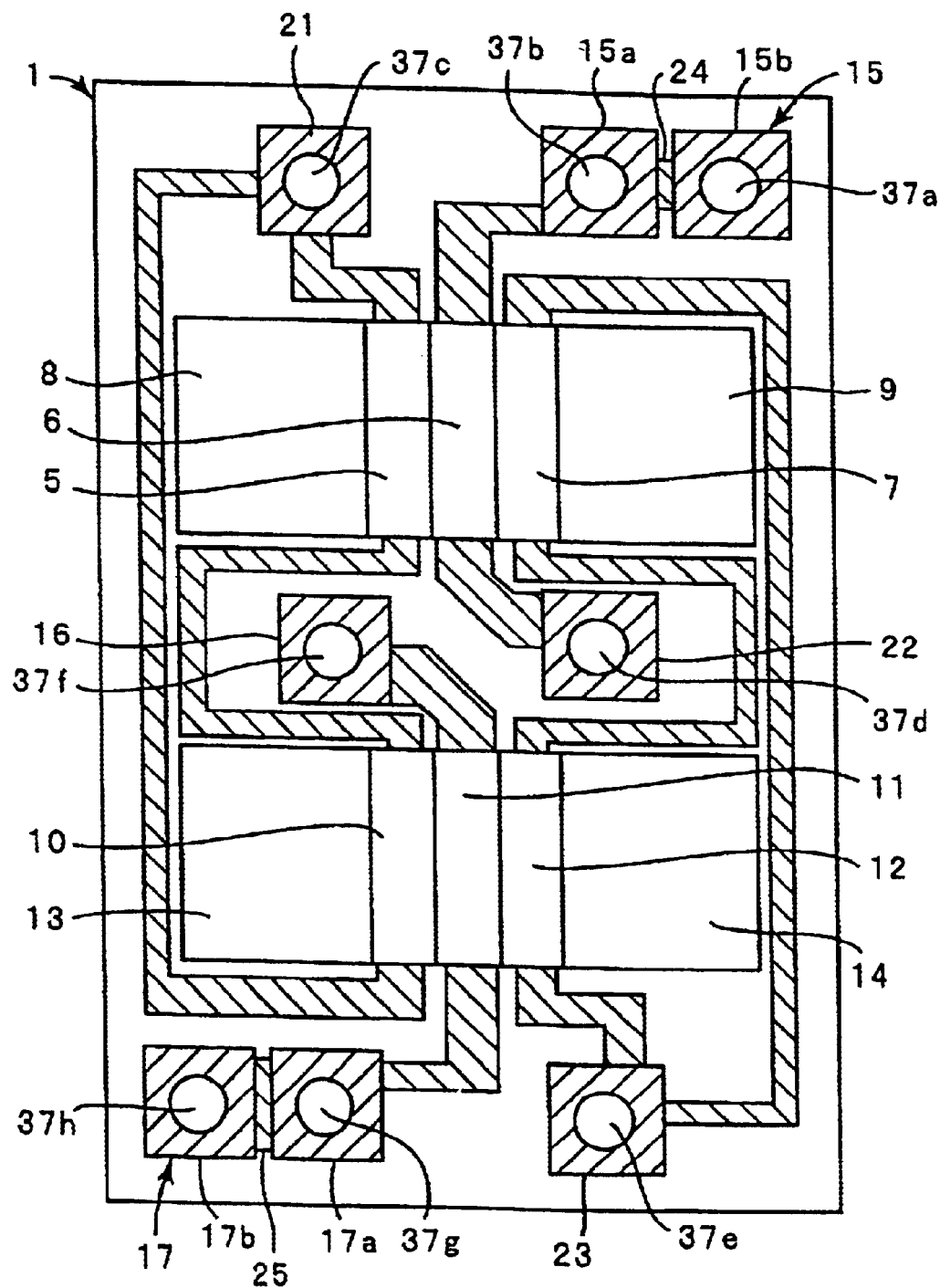
FIG. 2 is a schematic plan view for describing the layout of the electrodes constructed on a piezoelectric substrate in a first preferred embodiment of the present invention.

The actual layout on the piezoelectric substrate 2 of the above-mentioned surface acoustic wave device 1 is shown in a schematic plan view of FIG. 2. In FIG. 2, the IDTs 5 to 7 and 10 to 12 and the reflectors 8, 9, 13, and 14, preferably having a substantially rectangular shape, are schematically shown. Furthermore, the terminals 21 to 23 shown in FIG. 2 are connected to the ground potential. In FIG. 2, the unbalanced signal terminal 15, the balanced signal terminals 16 and 17, and the terminals 21 and 23 are illustrated as having a substantially rectangular shape, but these portions represent electrode pads which are electrically conductive to the electrodes of a package via bump bonding and the circles shown in the middle of the substantially rectangular electrode pads represent the bumps 37a to 37h.

Moreover, in the portions in which the unbalanced signal terminal 15 and the balanced signal terminal 17 are provided, two electrode pads 15a, 15b, 17a, and 17b are connected through conductive paths. That is, the unbalanced signal terminal 15 and the balanced terminal 17 are made electrically conductive to the electrodes of the package via the two electrode pads, respectively.

Figure 3:
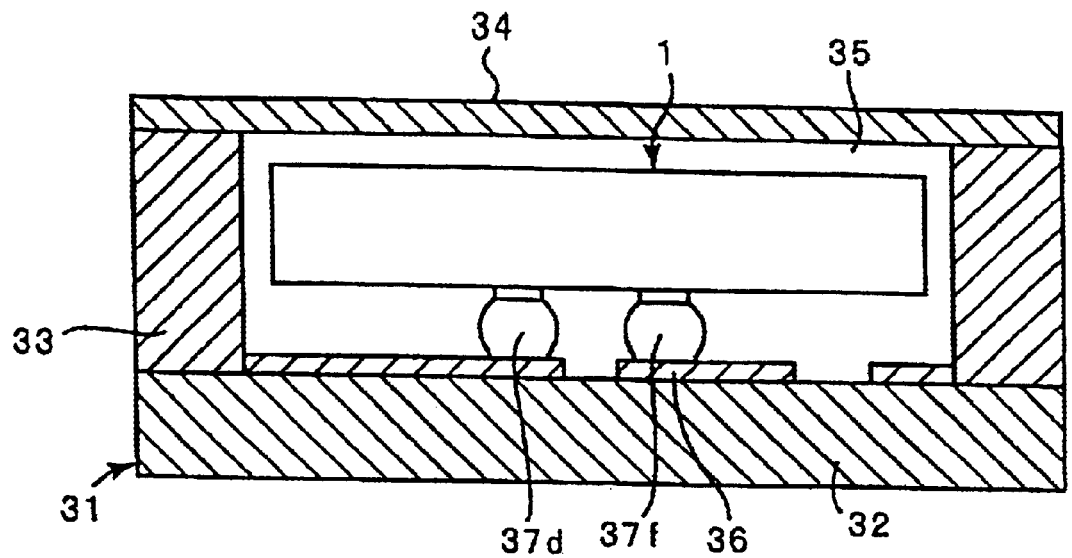
FIG. 3 is a sectional front view showing the construction of a surface acoustic wave device according to a first preferred embodiment of the present invention and showing the state in which a surface acoustic wave filter element is housed inside a package.

FIG. 3 is a schematic sectional front view showing the surface acoustic wave device 1 housed in the package. The package 31 contains a bottom plate 32, a side wall 33, and a cover material 34. The side wall 33 having a substantially rectangular frame shape is joined on the bottom plate 32 to constitute a housing space 35. The surface acoustic wave device 1 is housed inside the housing space 35 and the housing space 35 is closed up tight by the cover material 34.

The surface acoustic wave device 1 is joined and connected to the bottom plate 32 through the bumps so that the device is mounted in a face down arrangement or that the surface, on which the electrodes are disposed, of the piezoelectric substrate 2 faces downward. That is, the die attach portion 36 including a conductive film is disposed on the upper surface of the bottom plate 32. The above-mentioned electrode pads of the surface acoustic wave device 1 are joined and connected to this die attach portion 36 through the bumps 37d, 37f, etc.

Figure 4:
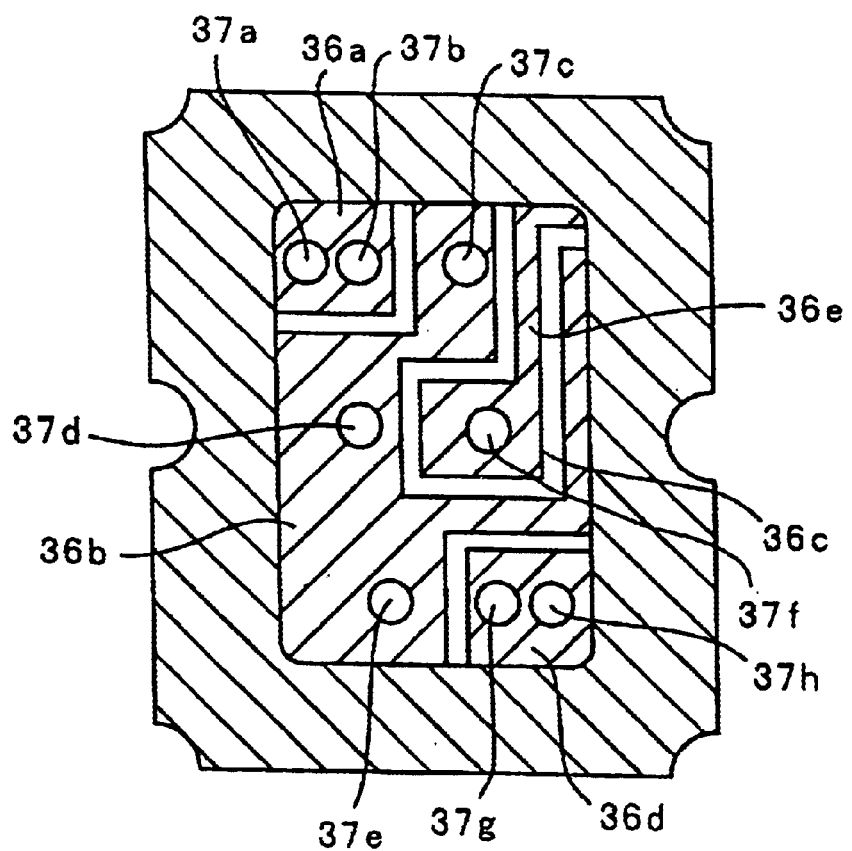
FIG. 4 is a schematic plan view for describing the electrodes disposed in the package used in a first preferred embodiment of the present invention.

The planar view of the above die attach portion 36 is shown in FIG. 4. The die attach portion 36 includes the electrodes 36a to 36e which are separated from each other. The electrode 36a is the portion which is electrically connected to the unbalanced signal terminal 15 shown in FIG. 2 and is connected to the unbalanced signal terminal 15 through the bumps 37a and 37b shown by the circles. The electrode 36b is electrically connected to the terminals 21 to 23 shown in FIG. 2 through the bumps 37c to 37e. Furthermore, the electrode 36c is electrically connected to the balanced signal terminal 16 through the bump 37f. The electrode 36d is connected to the balanced signal terminal 17 through the bumps 37g and 37h.

Then, a microstrip line 36e is linked to the electrode 36c. That is, the microstrip line 36e is connected in series to the balanced signal terminal 16.

The microstrip line 36e functions as a reactance component in the frequency band of the passband of an AMPS reception filter. In the present preferred embodiment, the above microstrip line 36e is constructed so as to add a reactance component of about 0.8 nH to the balanced signal terminal 16. The microstrip line 36e also functions as a delay line.

Figure 5:
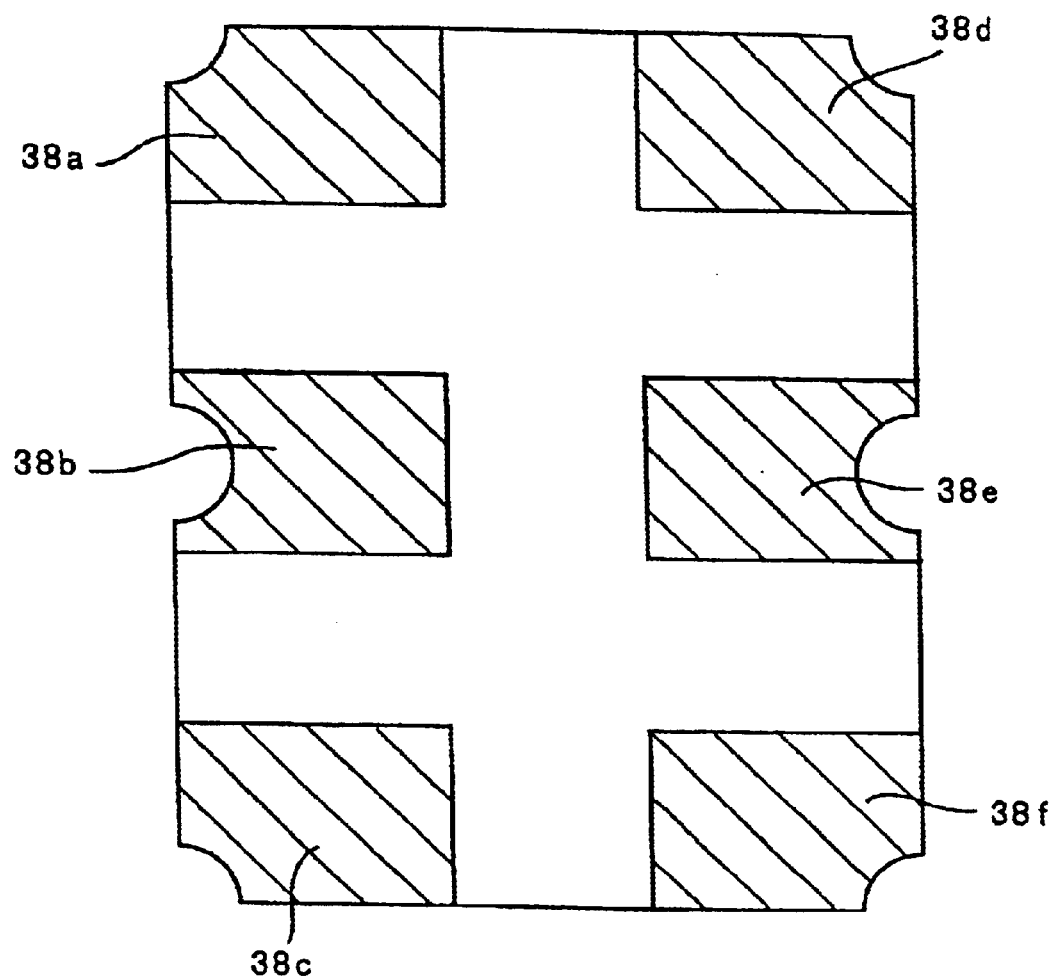
FIG. 5 is a schematic plan view for describing the external terminals provided on the lower surface of a bottom plate in the package of the first preferred embodiment of the present invention.

The above-mentioned electrodes 36a to 36d and the microstrip line 36e are electrically connected to the external terminals shown in FIG. 5. FIG. 5 is a schematic plan view showing the external terminals provided on the lower surface of the bottom plate 32 of the package 31. Moreover, in FIG. 5, the external terminals 38a to 38f are shown from a perspective of looking through the bottom plate 32. The external terminal 38a is electrically connected to the electrode 36a and the external terminals 38d and 38f are electrically connected to the microstrip line 36e and the electrode 36d connected to the balanced signal terminals, respectively. The external terminals 38b, 38c, and 38e to be connected to the ground potential are electrically connected to the above-mentioned electrode 36b.

The electrodes 36a, 36b, and 36d and the microstrip line 36e can be electrically connected to the external terminals 38a to 38f by forming through-hole electrodes passing through the bottom plate 32 in the bottom plate 32 or by forming a conductive film connecting the electrodes on the upper and lower surfaces through the side surface.

The surface acoustic wave device of the present preferred embodiment is characterized in that the above-mentioned microstrip line 36e is connected in series to one balanced signal terminal 16.

Figure 6:
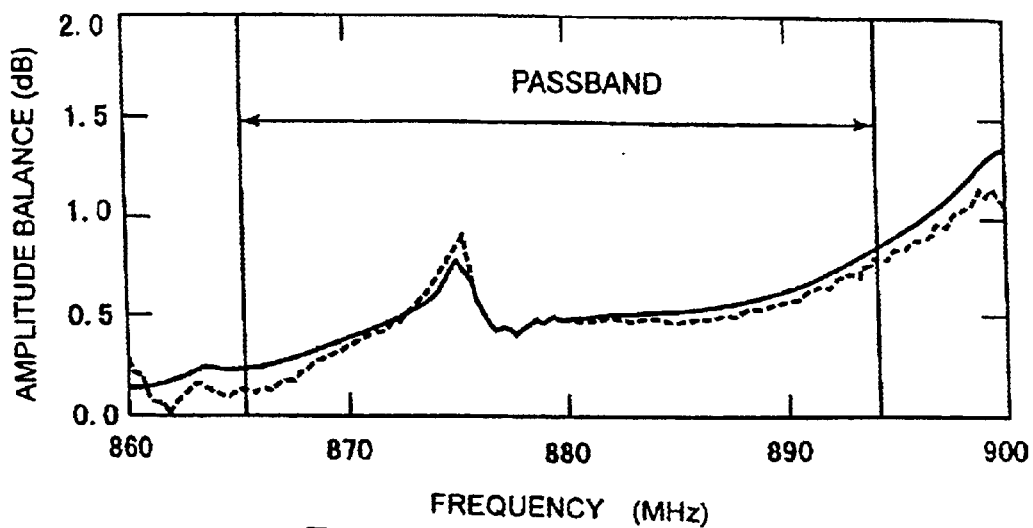
FIG. 6 shows the characteristics of amplitude balance to frequency of the first preferred embodiment of the present invention and a conventional example.
Figure 7:
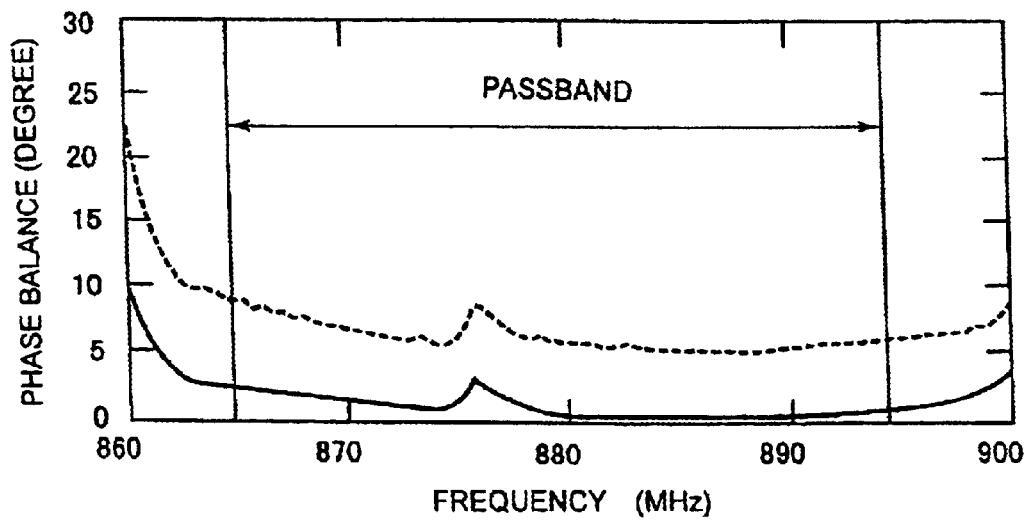
FIG. 7 shows the characteristics of phase balance to frequency of the first preferred embodiment and a conventional example.

The characteristic of amplitude balance to frequency and the characteristic of phase balance to frequency of the surface acoustic wave device according to the present preferred embodiment are shown by a solid line in FIGS. 6 and 7, respectively. For comparison, the characteristic of amplitude balance to frequency and the characteristic of phase balance to frequency of a surface acoustic wave device (referred to as a conventional example) which is constructed in the same way as the above-mentioned device except that the microstrip line is not provided are shown by a broken line in FIGS. 6 and 7.

Figure 8:
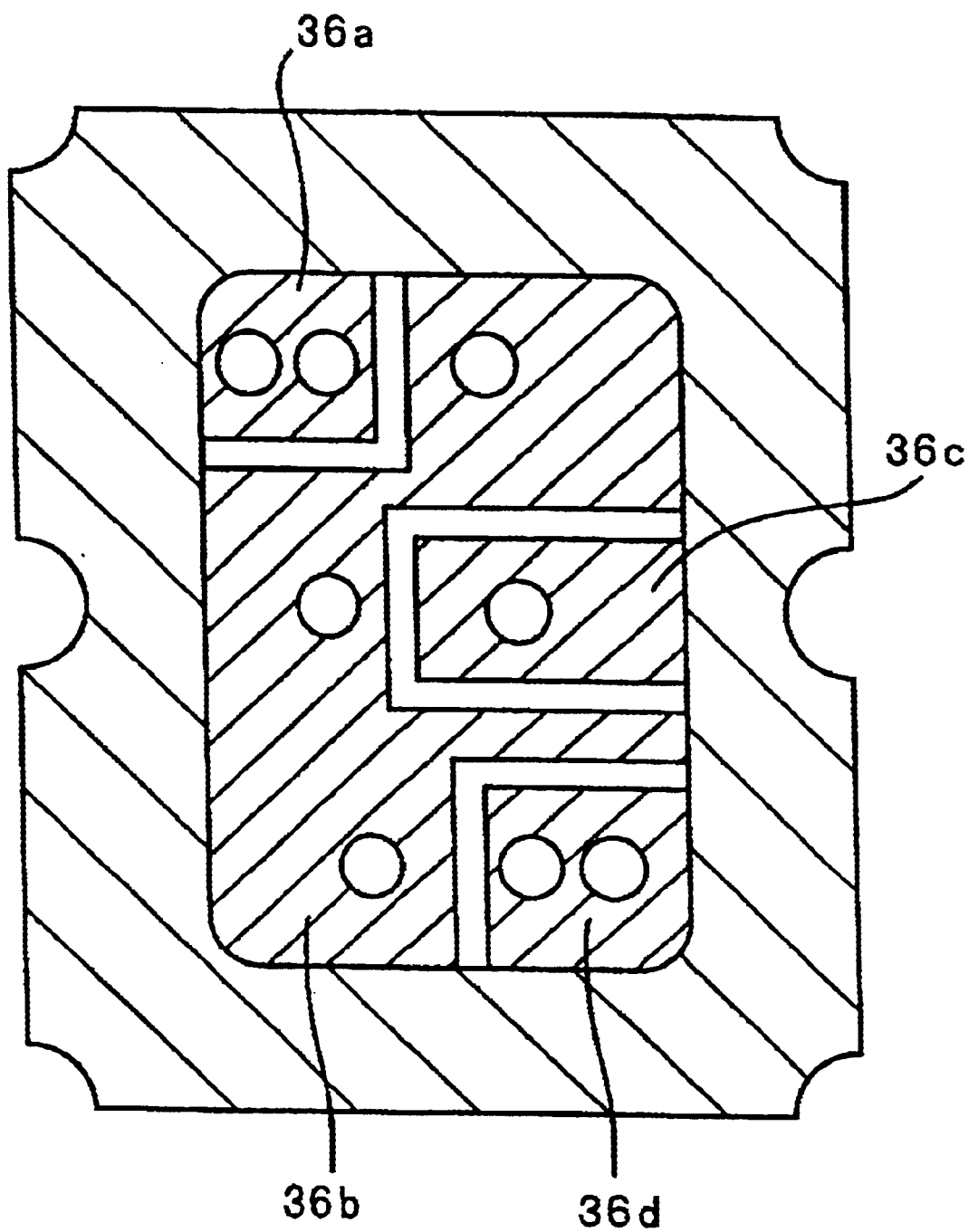
FIG. 8 is a schematic plan view for describing the electrodes provided in the package of a conventional example prepared for comparison with the first preferred embodiment of the present invention.

Moreover, the shape of the electrodes disposed on the upper surface of the bottom plate of the package of the above-mentioned conventional example is shown in FIG. 8. As clearly understood in FIG. 8, the shape of the electrode 36C connected to the balanced signal terminal is different from the electrode 36c shown in FIG. 4, and the microstrip line 36e is not connected. This electrode 36c is connected to the external terminal 38e. Furthermore, because the microstrip line is not provided, the shape of the electrode 36b connected to the ground potential is different from the case in FIG. 4. This electrode 36b is connected to the external terminals 38b, 38c, and 38d. Furthermore, the electrode 36a is connected to the external terminal 38a.

The frequency range of the passband in the AMPS reception filter is about 869 MHz to about 894 MHz. As clearly seen in FIG. 6, the maximum amplitude balance in this range is about 0.9 dB in the conventional example, but about 0.75 dB in the present preferred embodiment and accordingly the amplitude balance is improved by about 0.15 dB. Furthermore, as clearly seen in FIG. 7, the maximum phase balance is eight degrees in the conventional example, but about three degrees in the present preferred embodiment and accordingly the phase balance is improved by about five degrees.

The reason why the balances are improved in this way is that because the microstrip line 36e operating as a reactance component and a delay line is disposed in the package 31 and the reactance and the delay line is added to the balanced signal terminal 16, the difference in frequency characteristic between the balanced signal terminals 16 and 17 is corrected. The reactance component mainly improves the amplitude balance while the delay line improves the phase balance. It is to be noted that as long as either the amplitude balance or the phase balance is improved, the effect of the present invention is achieved. Thus, it is preferable that at least one of a reactance component or a delay line is added to one of the balance signal terminals.

That is, although the difference in frequency characteristic between the first and second balanced signal terminals 16 and 17 is dependent on the construction of surface acoustic wave elements, the layout of electrodes in the package 31, and the design parameters, the balancing can be improved by adding a reactance component or the delay line to one of the balanced signal terminals as described above. In other words, by adding a reactance component or a delay line to one signal terminal so as to compensate the difference in frequency characteristic between the first and second balanced signal terminals, the balancing can be improved.

Therefore, according to the present preferred embodiment, by adding a reactance component or the delay line of the microstrip line provided in the package to one of the two balanced signal terminals in the surface acoustic wave device having the function of balanced-to-unbalanced conversion, the balance can be effectively improved when compared with the conventional example.

Although the present preferred embodiment is constructed so as to have no electrically neutral point between the balanced signal terminals 16 and 17, also the same effect can be obtained in a surface acoustic wave device having an electrically neutral point. This will be described with reference to FIG. 9.

Figure 9:
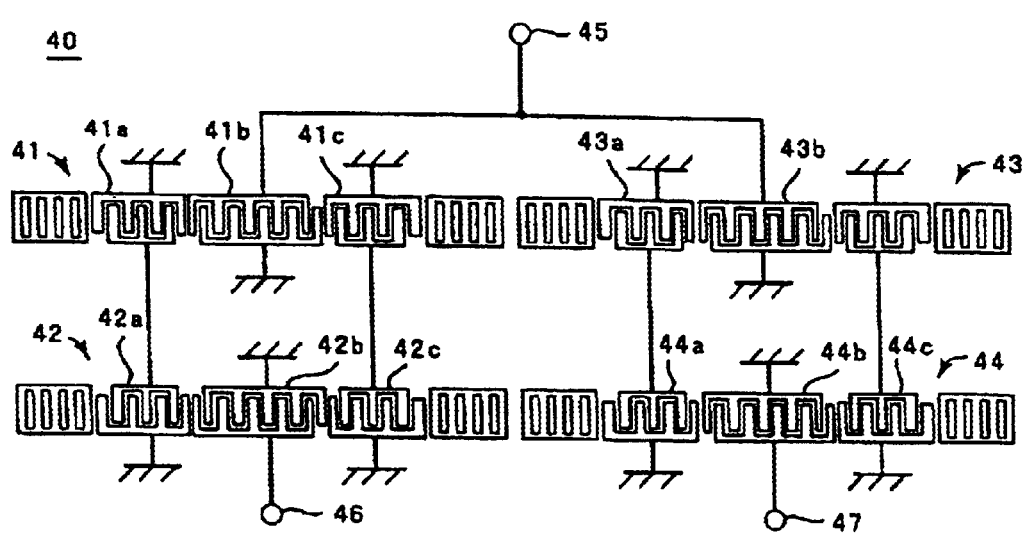
FIG. 9 is a schematic plan view for describing another example of a surface acoustic wave device to which various preferred embodiments of the present invention are applied.

In a surface acoustic wave device as a modified example shown in FIG. 9, a surface acoustic wave device using first to fourth longitudinally coupled resonator type surface acoustic wave filters 41 to 44 and having the function of balanced-to-unbalanced conversion is provided. The longitudinally coupled resonator type surface acoustic wave filters 41 to 44 include a longitudinally coupled resonator type surface acoustic wave filter of a three-IDT type having first to third IDTs disposed along the surface wave propagation direction, respectively. One end of the middle second IDTs 41b and 43b of the longitudinally coupled resonator type surface acoustic wave filters 41 and 43 is commonly connected to an unbalanced signal terminal 45. The other end of the IDTs 41b and 43b is connected to the ground potential. Furthermore, one end of each of the first and third IDTs 41a and 41c of the longitudinally coupled resonator type surface acoustic wave filter 41 is connected to the ground potential, and the other end of each is connected to one end of the first and third IDTs 42a and 42c of the longitudinally coupled resonator type surface acoustic wave filter 42, respectively. The other end of the IDTs 42a and 42c is connected to the ground potential. One end of the IDT 42b is connected to the ground potential and the other end is electrically connected to a balanced signal terminal 46.

In the same way, one end of the IDTs 43a and 43c is connected to the ground potential, and the other end is connected to one end of the first and third IDTs 44a and 44c of the longitudinally coupled resonator type surface acoustic wave filter 44, respectively. The other end of the IDTs 44a and 44c is connected to the ground potential. One end of the middle second IDT 44b of the IDT 44 is connected to the ground potential, and the other end is electrically connected to a balanced signal terminal 47.

Here, the phase of the middle second IDTs 42b and 44b is reversed between the longitudinally coupled resonator type surface acoustic wave filters 42 and 44. Also in the surface acoustic wave device 40 shown in FIG. 9, the balance can be improved by adding a reactance component or a delay line, in accordance with the difference in frequency characteristic, to the balanced signal terminal 46 or the balanced signal terminal 47.

Figure 10:
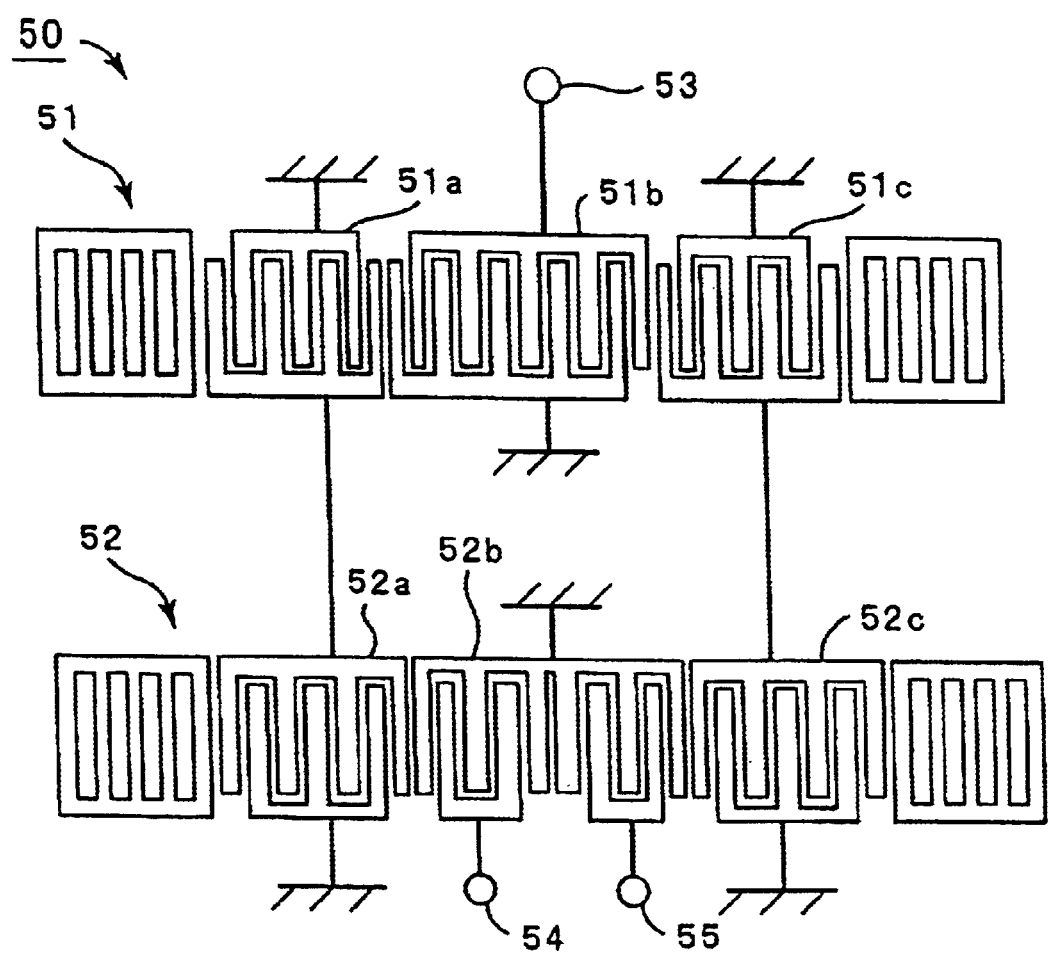
FIG. 10 is a schematic plan view for describing further another example of a surface acoustic wave device to which various preferred embodiments of the present invention are applied.

In the same way, in a surface acoustic wave device 50 in which two stages of longitudinally coupled resonator type surface acoustic wave filters 51 and 52 are cascade-connected as shown in FIG. 10, the balance can be improved by adding a reactance component or a delay line to one of balanced signal terminals 54 and 55. Moreover, in the surface acoustic wave device 50, an unbalanced signal terminal 53 is connected to one end of the middle IDT 51b of the longitudinally coupled resonator type surface acoustic wave filter 51. Furthermore, one comb-like electrode in the middle IDT 52b of the longitudinally coupled resonator type surface acoustic wave filter 52 is divided, and to a pair of the divided portions the balanced signal terminals 54 and 55 are connected. Then, the IDTs 51a and 51c are electrically connected to the IDTs 52a and 52c so as to perform the function of balanced-to-unbalanced conversion.

Figure 11:
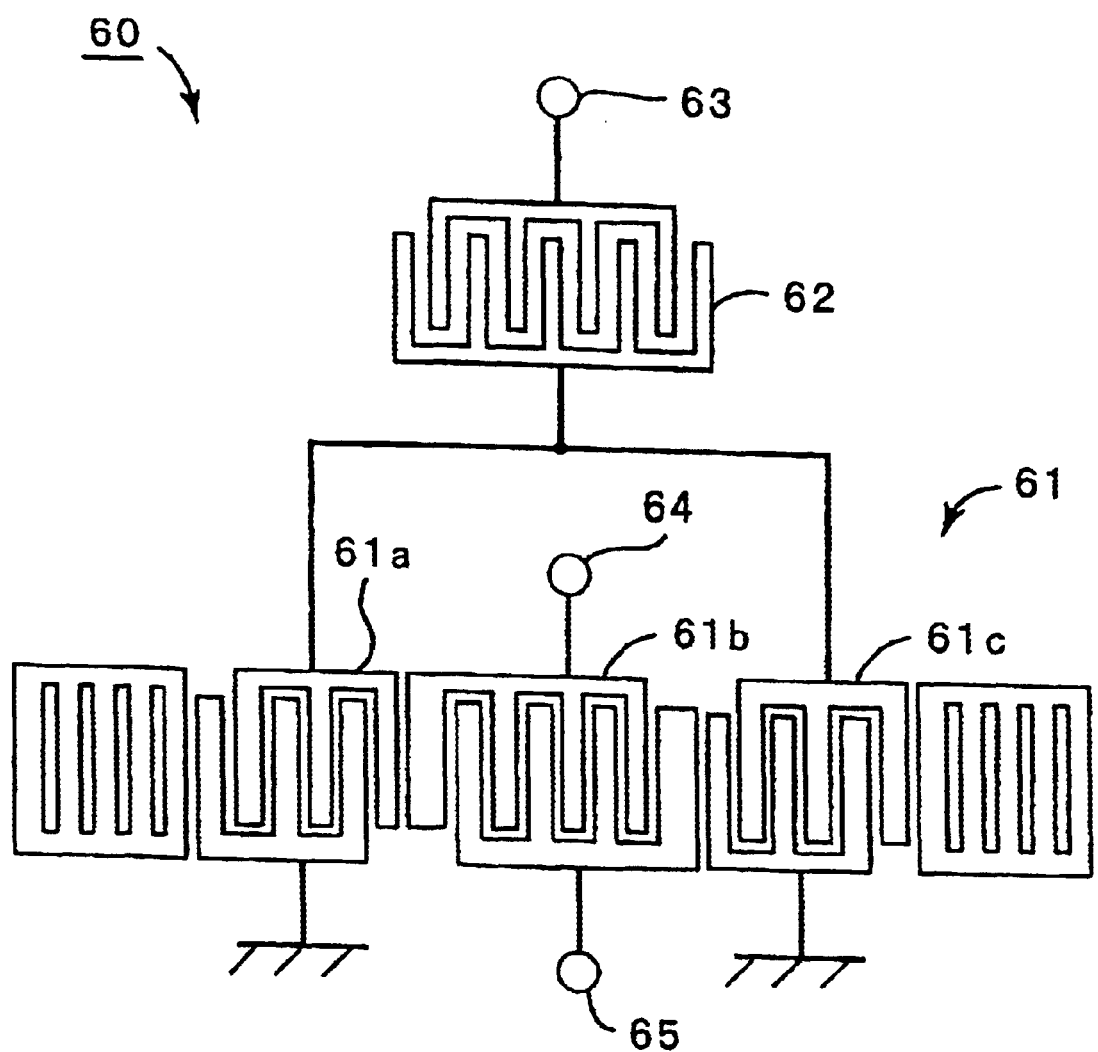
FIG. 11 is a schematic plan view for describing another example of a surface acoustic wave device to which various preferred embodiments of the present invention are applied.
Figure 12:
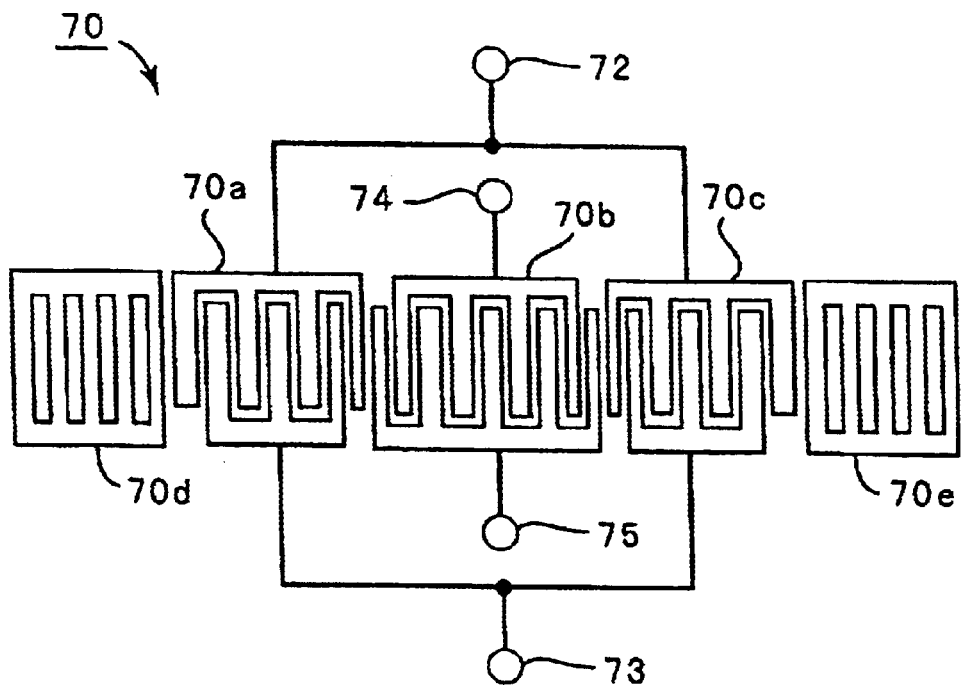
FIG. 12 is a view showing another example of a surface acoustic wave device to which various preferred embodiments of the present invention are applied, the surface acoustic wave device in which either the input side or the output side is made balanced signal terminals.

FIGS. 11 and 12 are schematic plan views for describing other modified examples of a surface acoustic wave device having the function of balanced-to-unbalanced conversion to which various preferred embodiments of the present invention can be applied.

In the surface acoustic wave device 60 shown in FIG. 11, a longitudinally coupled resonator type surface acoustic wave filter 61 preferably includes first to third IDTs 61a to 61c and one end of the first to third IDTs 61a to 61c is connected to an unbalanced signal terminal 63 through a surface acoustic wave resonator 62. One end of the middle second IDT 61 is connected to a balanced signal terminal 64 and the other end is connected to another balanced signal terminal 65. Here, also the balance can be improved by adding a reactance component or a delay line to one of the balanced signal terminals 64 and 65.

Moreover, in FIG. 11, the surface acoustic wave resonator 62 is connected in series to the longitudinally coupled resonator type surface acoustic wave filter 61, but a surface acoustic wave resonator may be connected in parallel. Alternatively, other preferred embodiments of the present invention can be applied to a construction in which surface acoustic wave resonators are connected in series and in parallel at the same time.

Furthermore, the present invention is not limited to a surface acoustic wave device having the function of balanced-to-unbalanced conversion, and, as shown in FIG. 12, the present invention can be applied to a surface acoustic wave device in which both input and output ends have a pair of balanced signal terminals, and then the balance can be improved in the same way as in the above-described preferred embodiments. In the surface acoustic wave device 70 shown in FIG. 12, first to third IDTs 70a to 70c are arranged along the surface wave propagation direction. On both sides of an area in which the IDTs 70a to 70c are provided, reflectors 70d and 70e are disposed.

One end of the first and third IDTs 70a and 70c is connected to a balanced signal terminal 72 and the other end is connected to a balanced signal terminal 73. One end the second IDT 70b is connected to a balanced signal terminal 74 and the other end is connected to a balanced signal terminal 75. However, both input and output sides contain the first and second balanced signal terminals. Also in this case, the balance can be improved by adding a reactance component or a delay line to one balanced signal terminal between a pair of the balanced signal terminals on the input side and/or the output side.

Moreover, the above-described preferred embodiments and surface acoustic wave devices to which various preferred embodiments of the present invention can be applied were described attaching importance to a construction in which a longitudinally coupled resonator type surface acoustic wave filter is used and a balanced signal is input or output, but the present invention can also be applied to a construction in which a transverse coupling resonator type surface acoustic wave filter and a transversal type surface acoustic wave filter are used and a balanced signal is output or input.

Furthermore, the microstrip line was preferably provided on the package 31 in the above-described preferred embodiments, but the microstrip line may be disposed on the piezoelectric substrate.

Figure 13:
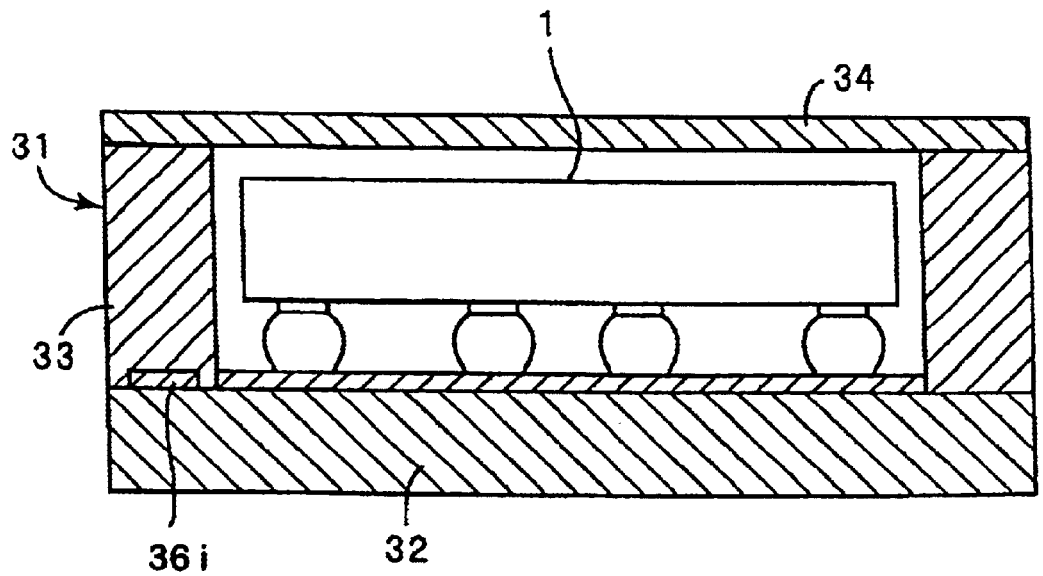
FIG. 13 is a schematic sectional front view showing a surface acoustic wave device as a modified example of the first preferred embodiment.
Figure 14:
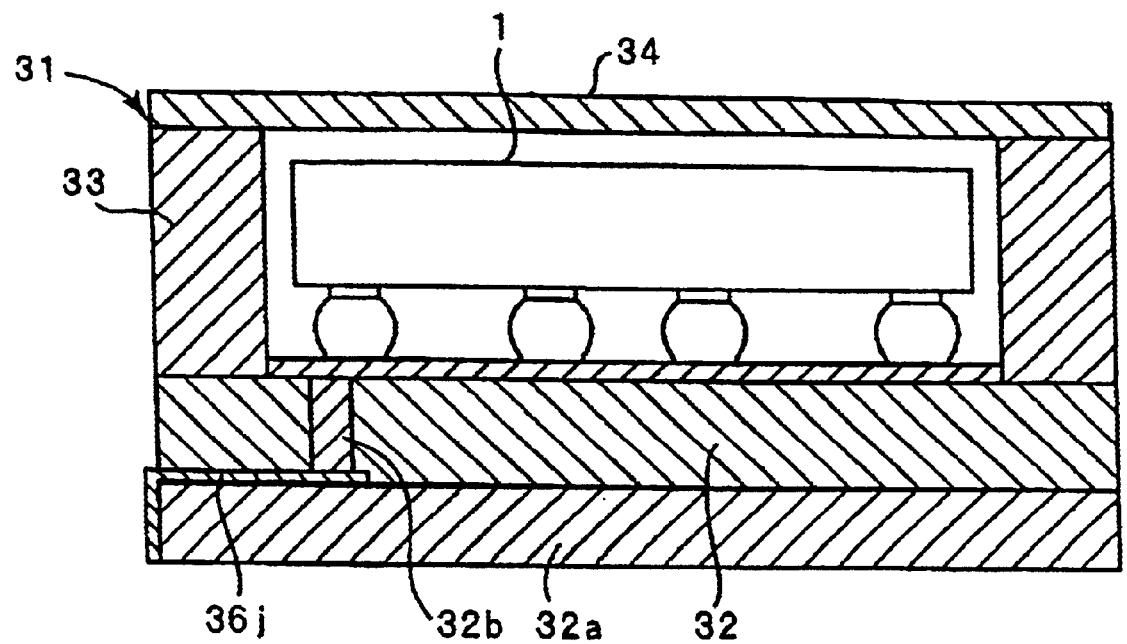
FIG. 14 is a schematic sectional front view for describing another modified example of the first preferred embodiment.

Furthermore, the microstrip line 36e was preferably provided on the die attach portion 36 of the package 31 in the above-described preferred embodiments, but a method for forming a microstrip line is not limited to this in the present invention. For example, a microstrip line 36i may be disposed between the bottom plate 32 and the side wall 33 of the package 31 as shown in FIG. 13, and a microstrip line 36j may be disposed between a substrate layer 32a and the lower surface of the bottom plate 32 after the substrate layer 32a has been formed on the lower surface of the bottom plate 32 as shown in FIG. 14. In this case, the microstrip line 36a may be electrically connected to the die attach portion 36 through a through-hole electrode 32b with which the bottom 32 is provided.

As is clearly seen in FIGS. 13 and 14, the location at which a microstrip line for adding a reactance component or a delay line is constructed on the package side is not particularly limited.

Furthermore, the longitudinally coupled resonator type surface acoustic wave filter 3 and the longitudinally coupled resonator type surface acoustic wave filter 4 had the same construction in the first preferred embodiment, but the design parameters such as the cross width of electrode fingers, and other elements, may be made different between the filters when necessary.

Furthermore, a 40±5° Y cut X propagation LiTaO$_3$ substrate was preferably used as a piezoelectric substrate 2, but the piezoelectric substrate is not limited to that in the present invention and, for example, an appropriate piezoelectric substrate such as a 64° to 72° Y cut X propagation LiTaO$_3$ substrate, a 41° Y cut X propagation LiTaO$_3$ substrate, or other suitable substrate may be used.

Figure 15:
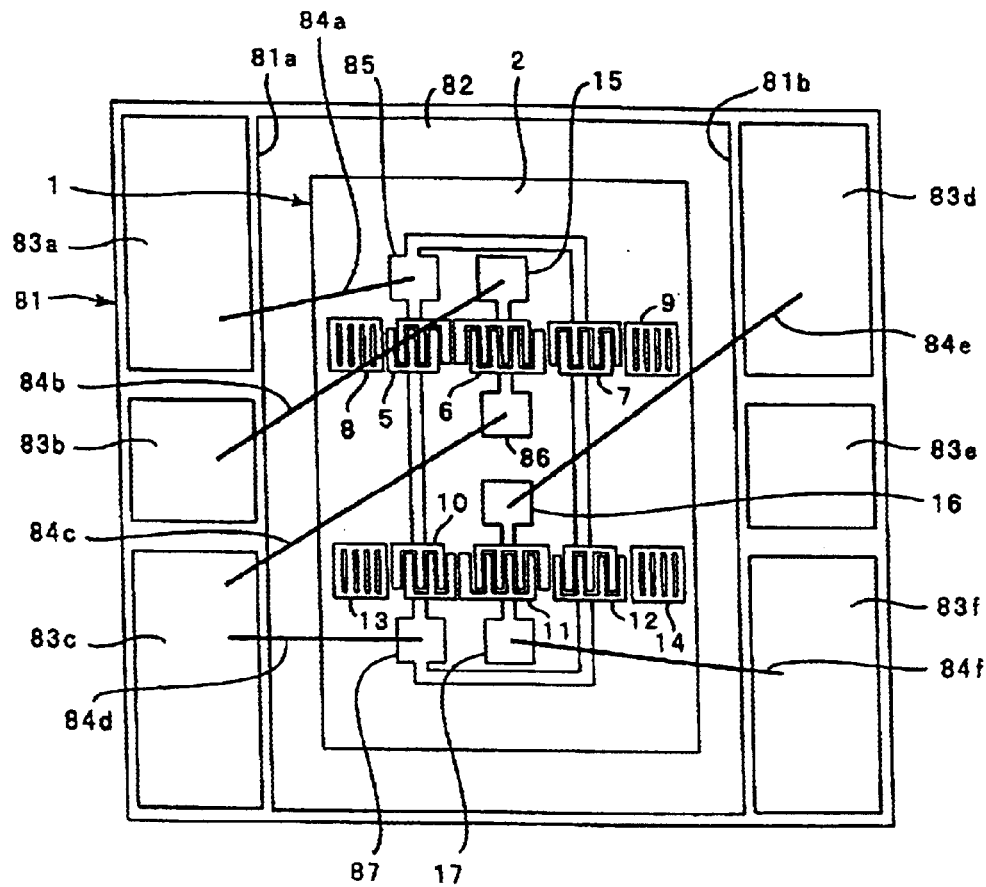
FIG. 15 is a plan view for describing a surface acoustic wave device according to a second preferred embodiment of the present invention.

FIG. 15 is a schematic plan view for describing a surface acoustic wave device according to yet another preferred embodiment of the present invention.

In the longitudinally coupled resonator type surface acoustic wave filter of the first preferred embodiment, each electrode on the piezoelectric substrate 2 was preferably electrically connected to the electrode of the package, but in the present invention, the electrode of the package may be electrically connected to a surface acoustic wave element through a bonding wire. In the preferred embodiment shown in FIG. 15, the surface acoustic wave filter elements are electrically connected to the electrodes of the package by a bonding wire.

In FIG. 15, the electrodes of the surface acoustic wave device 1 are preferably constructed nearly in the same way as in the first preferred embodiment. Therefore, the same portion is illustrated by the same reference numeral and the description is omitted.

In the second preferred embodiment, the package 81 contains a housing space 82 in the middle. A piezoelectric substrate 2 is fixed in this housing space 82 by using an insulating adhesive (not illustrated). Step portions 81a and 81b are disposed on both sides of the housing space 82. The height of the step portions 81a and 81b is made higher than the portion in which the surface acoustic wave device 1 is housed. Furthermore, although not illustrated, a cover material is fixed so as to extend between the step portions 81a and 81b and close the housing space 82.

On the step portions 81a and 81b, electrodes 83a to 83f are provided. The electrodes 81a to 83f function as external terminals that electrically connect the surface acoustic wave device to the outside.

Moreover, the location of the pads connected to the IDTs on the piezoelectric substrate 2 is a little different from the electrode pads shown in FIG. 2. But the locations of the electrode pads are such that the connection by a bonding wire is easy.

The electrode 83b with which the package 81 is provided is electrically connected to an unbalanced signal terminal 15 through a bonding wire 84b. Furthermore, the electrodes 83d and 83f are electrically connected to balanced signal terminals 15 and 17 through bonding wires 84e and 84f, respectively. The electrodes 83a, 83c, and 83e are connected to the ground potential and an electrode pad 85 is electrically connected to the electrode 83a through a bonding wire 84a. The electrode pad 85 is connected to one end of IDTs 5 and 7. The electrode 83c is electrically connected to an electrode pad 86 through a bonding wire 84c. The electrode pad 86 is electrically connected to an IDT 6.

The electrode 83c is electrically connected to an electrode pad 87 through a bonding wire 84d. The electrode pad 87 is electrically connected to IDTs 10 and 12.

In the present preferred embodiment, the length of the bonding wires 84e and 84f is preferably different from each other. That is, the bonding wire 84e is longer than the bonding wire 84f and, because of that, one balanced signal terminal 16 has a larger reactance component than another balanced signal terminal 17 and, by compensating the difference in frequency between both the balanced signal terminals 16 and 17, the balance is improved.

More specifically, the bonding wire 84e has a length so as to add a reactance component of about 1.0 mH and the bonding wire 84f has a length to add a reactance component and a delay line of about 0.5 mH in the present preferred embodiment. Therefore, a larger reactance component and a delay line is added to the side of the balanced signal terminal 16 than to the side of the balanced signal terminal 17 and the bonding wires function in the same way as the microstrip line 36e in the first preferred embodiment.

Figure 16:
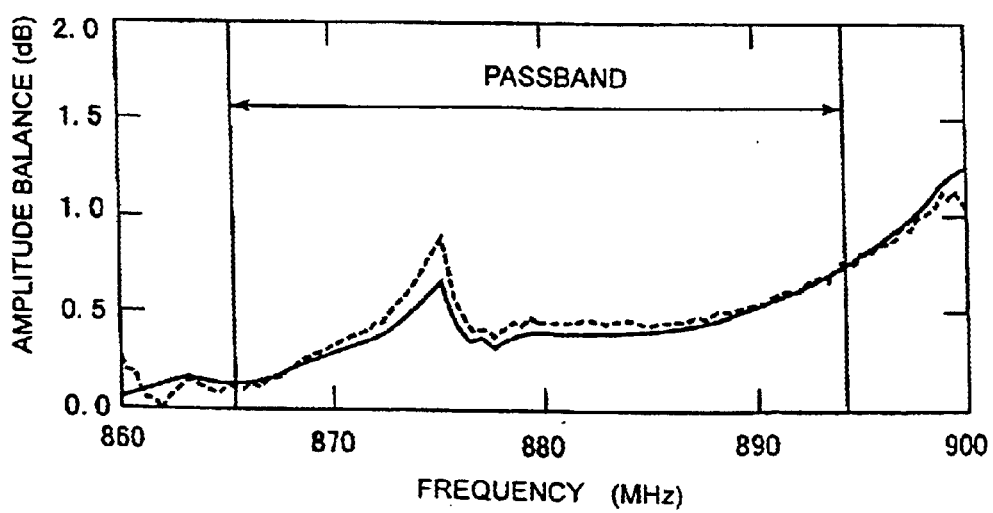
FIG. 16 shows the characteristics of amplitude balance to frequency of the second preferred embodiment and a conventional surface acoustic wave device prepared for comparison.
Figure 17:
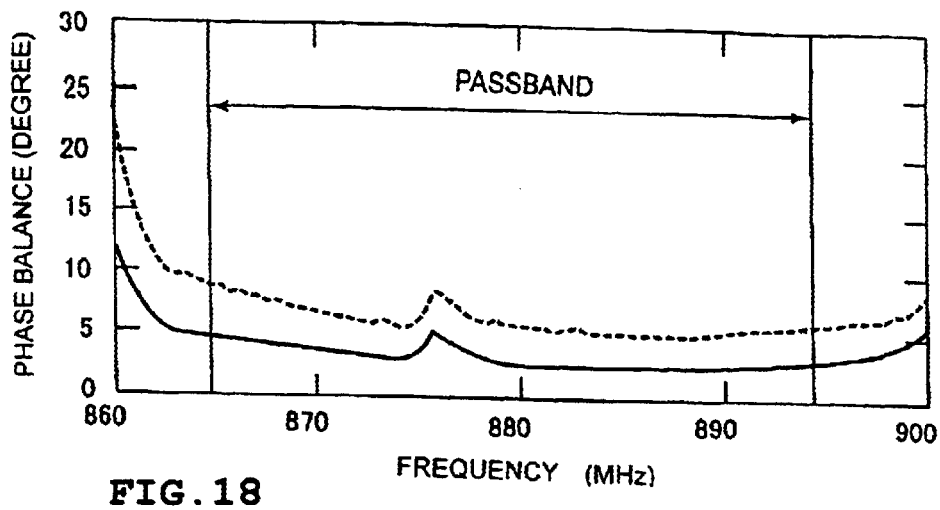
FIG. 17 shows the characteristics of phase balance to frequency of the second preferred embodiment and a conventional surface acoustic wave device prepared for comparison.

The characteristic of amplitude balance to frequency and the characteristic of phase balance to frequency of the surface acoustic wave device of the present preferred embodiment are shown by a solid line in FIGS. 16 and 17.

Figure 18:
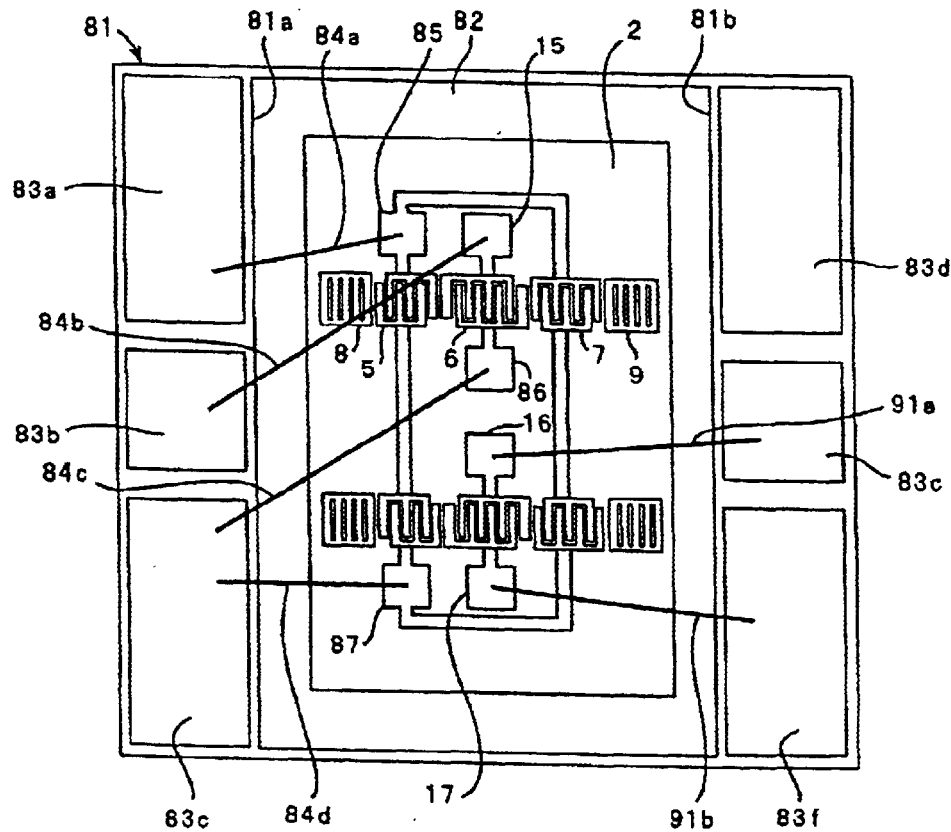
FIG. 18 is a schematic plan view of a conventional surface acoustic wave device prepared for comparison with the second preferred embodiment of the present invention.

For comparison, a surface acoustic wave device 90 shown in FIG. 18 was prepared. Here, the lengths of bonding wires 91a and 91b are equal to each other. That is, the lengths of the bonding wires connected to balanced signal terminals 16 and 17 are equal to each other. The others are constructed in the same way as in the second preferred embodiment of the present invention. The characteristic of amplitude balance to frequency and the characteristic of phase balance to frequency of the surface acoustic wave device prepared for comparison, which is shown in FIG. 18, are shown by a broken line in FIGS. 16 and 17.

As clearly seen in FIG. 16, in 869 MHz to 894 MHz which is the frequency range of the passband in the AMPS reception filter, the maximum amplitude balance is 0.9 dB in the conventional example, but 0.7 dB in the second preferred embodiment, and the amplitude balance is improved by about 0.2 dB. Furthermore, as clearly seen in FIG. 17, the maximum phase balance is eight degrees, but five degrees in the second preferred embodiment, and it is understood that the phase balance is improved by about three degrees in this preferred embodiment of the present invention.

That is, because the lengths of the bonding wires connected to the balanced signal terminals 16 and 17 are different from each other as described above, a larger reactance component and a delay line is provided in one balanced signal terminal 16, and the difference between the frequency characteristics of the balanced signal terminals 16 and 17 is corrected and, as a result, the balance is improved.

Moreover, in the second preferred embodiment, a larger reactance component and the delay line was added to the balanced signal terminal 16, but when the difference between the frequency characteristics of the balanced signal terminals 16 and 17 is reversed, a larger reactance component and a delay line may be added to the side of the balanced signal terminal 17.

Furthermore, although a reactance component and delay line is added in the first and second preferred embodiments as described above, a delay line may be added instead of a reactance component and a delay line and then the same effect can be obtained.

Figure 19:
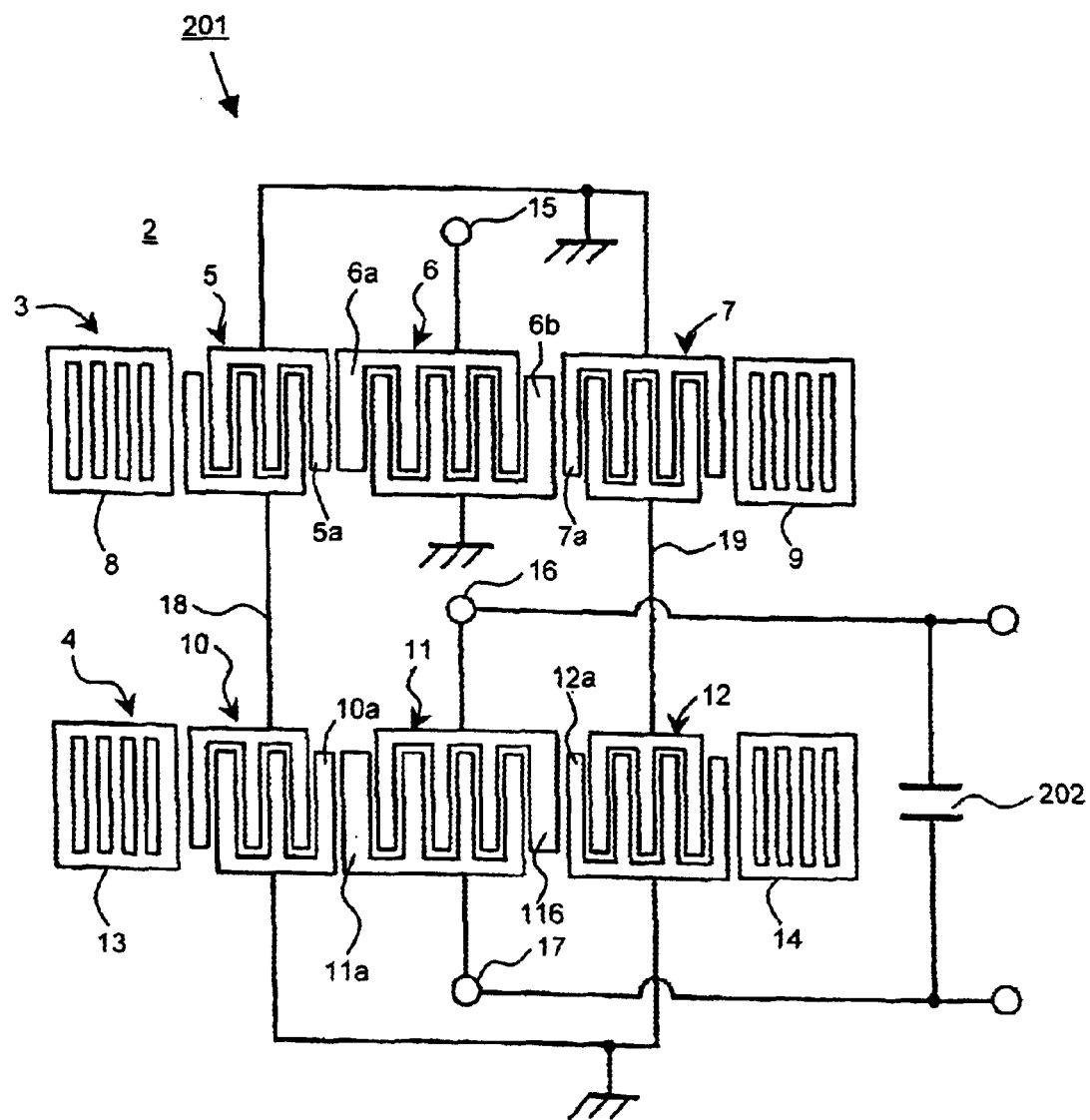
FIG. 19 is a plan view for describing a surface acoustic wave device according to a third preferred embodiment of the present invention.

FIG. 19 is a schematic plan view showing an electrode structure of a surface acoustic wave device according to a third preferred embodiment of the present invention.

The surface acoustic wave device 201 according to the third preferred embodiment has the same structure as the surface acoustic wave device 1 shown in FIG. 1 except that a capacitor 202 is connected between the balance signal terminals 16 and 17 as an external component. The static capacitance of the capacitor is preferably about 1 pF.

Figure 20:
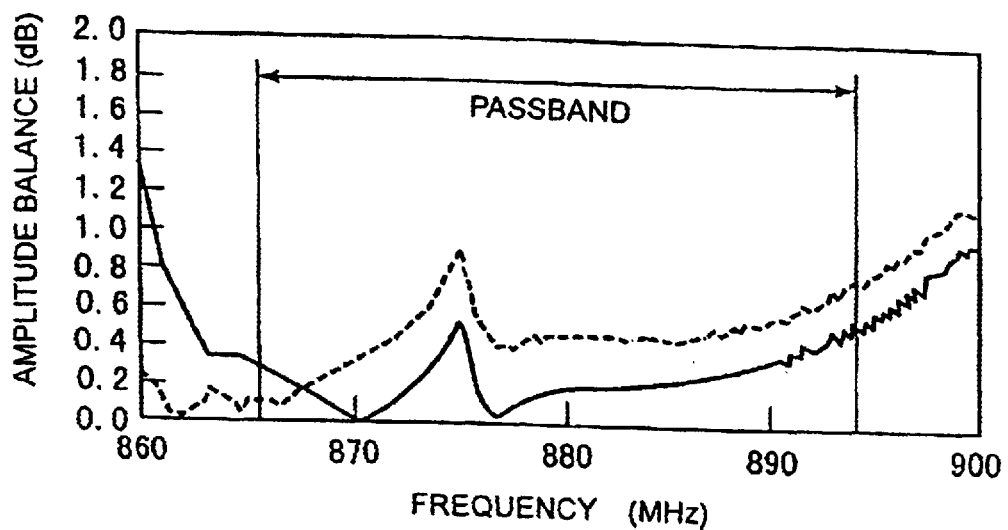
FIG. 20 shows the characteristics of amplitude balance to frequency of the third preferred embodiment and a conventional example.
Figure 21:
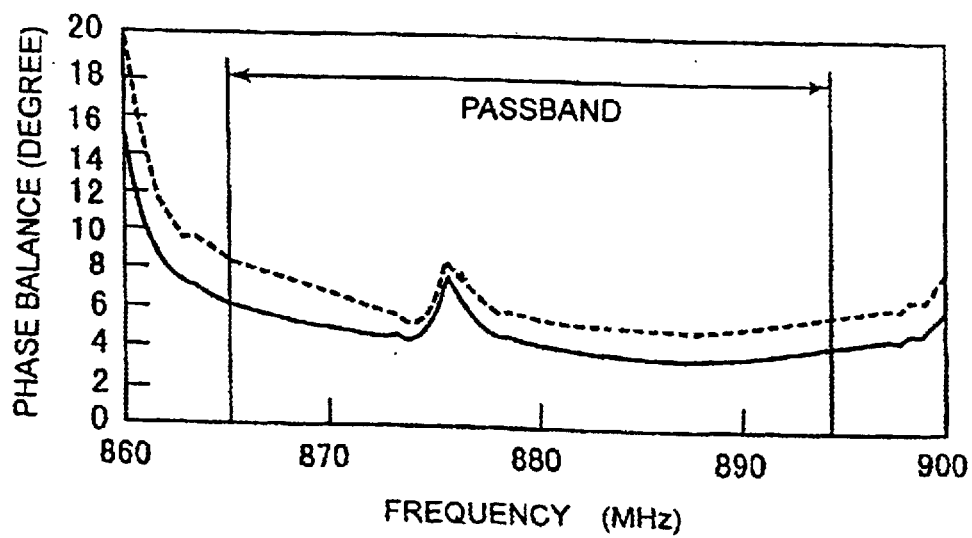
FIG. 21 shows the characteristics of phase balance to frequency of the third preferred embodiment and a conventional example.

FIGS. 20 and 21 respectively show by solid lines the relationship between the frequency characteristics and the amplitude balance and the relationship between the frequency characteristics and the phase balance. FIGS. 20 and 21 also shows by dotted lines those characteristics of the surface acoustic wave device that was produced in the same way except no capacitor 202 was provided.

As is apparent from FIG. 20, while the maximum amplitude balance within the frequency of passband in the filter used for an AMPS receiver is 0.9 dB in the surface acoustic wave device prepared for comparison, the device according to the present preferred embodiment gives 0.5 dB. Therefore, the amplitude balance is improved by about 0.4 dB with the present preferred embodiment of the present invention.

Also, as is apparent from FIG. 21, while the surface acoustic wave device having no external capacitor 202 shows 80 of maximum phase balance, the device according to the present preferred embodiment shows 80 of maximum phase balance. Thus, the phase balance is improved by about 10.

These improvements in the balance according to the third preferred embodiment result from adjustment of the deviation in the frequency characteristics between the balance signal terminals 16 and 17 by the added capacitance component between the balance signal terminals 16 and 17.

Figure 22:
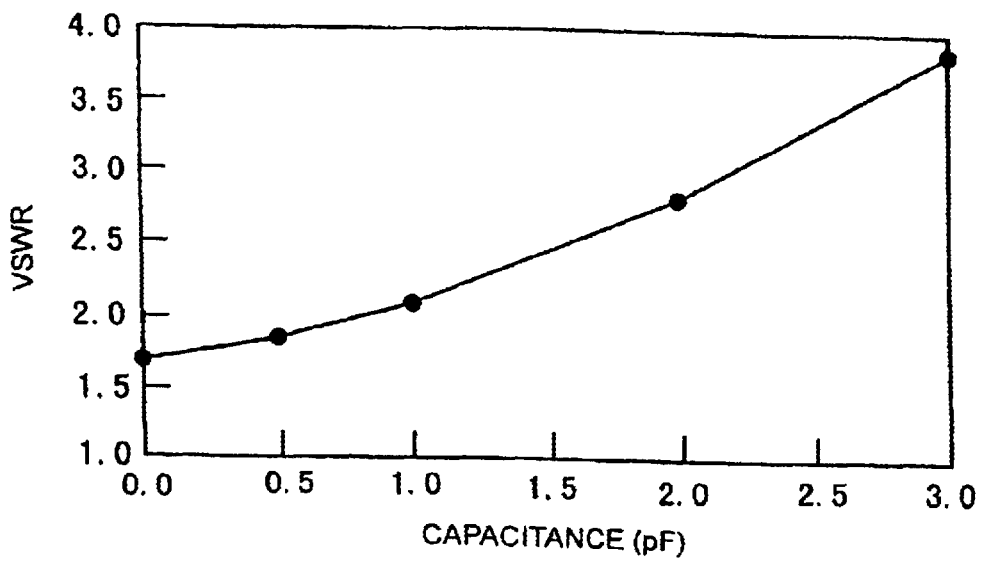
FIG. 22 shows the relationship between a capacitance of a capacitor to be added in the third preferred embodiment and the VSWR.
Figure 23:
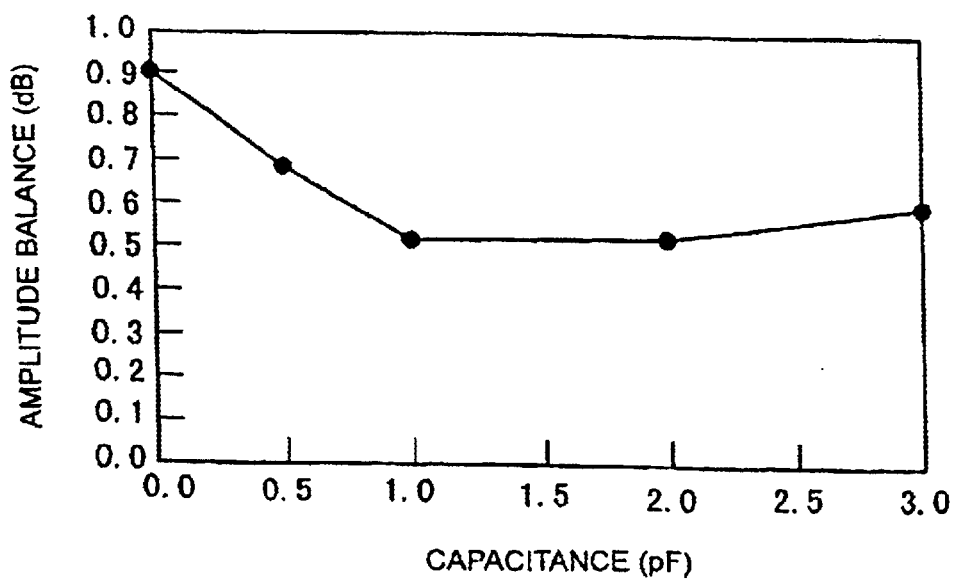
FIG. 23 shows the relationship between a capacitance of a capacitor to be added in the third preferred embodiment and amplitude balance.

As explained above, the balance within the passband is improved by adding the capacitance component between the balance signal terminals. However, there might be a possibility of a degradation of VSWR within the passband. In view of the possibility, the VSWR, amplitude balance and shift balance are measured in accordance with the change in the capacitance of the capacitor to be added as indicated in FIGS. 22 to 24.

Figure 24:
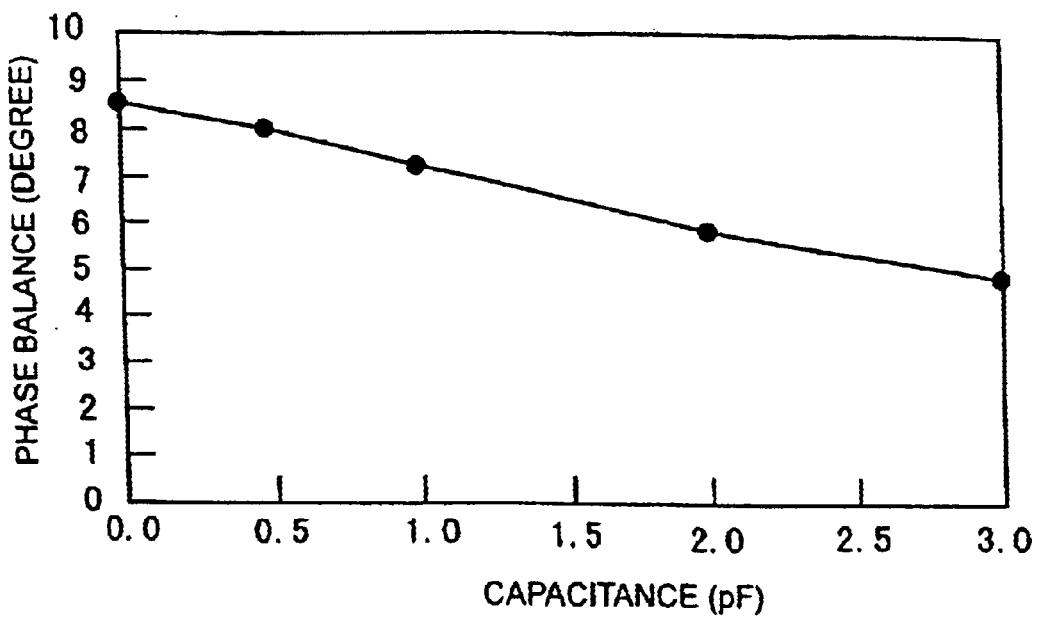
FIG. 24 shows the relationship between a capacitance of a capacitor to be added in the third preferred embodiment and phase balance.

As is apparent FIG. 24, VSWR degrades in accordance with an increase in capacitance of the capacitor. FIG. 23 shows that the phase balance becomes smaller within the capacitance of 1 pF to 2 pF and increase at the capacitance more than 3 pF. For these reasons, it is preferable that the capacitance of the capacitor is about 2 pF or less.

Figure 25:
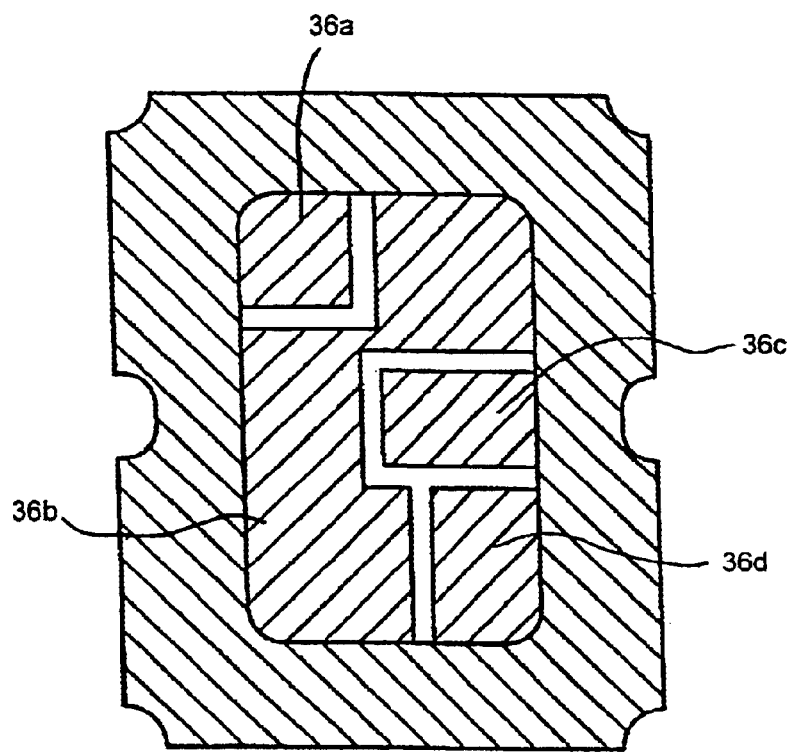
FIG. 25 is a schematic plan view illustrating an example in which a capacitance component is defined by an electrode on a package side.

Although in the third preferred embodiment, the capacitor to add the capacitance component between the pair of balance signal terminal is provided outside a package of a surface acoustic wave device, the same effect can be achieved by increasing the capacitance component between the balance signal terminals 16 and 17 within the package of the surface acoustic wave device. For example, in order to increase the capacitance component between the balance signal terminals 16 and 17, the ground electrode line between the electrodes 36c and 36d may be removed in the structure shown in FIG. 8, and the electrodes 36c and 36d may be disposed so as to be adjacent with each other, as shown in FIG. 25.

Figure 26:
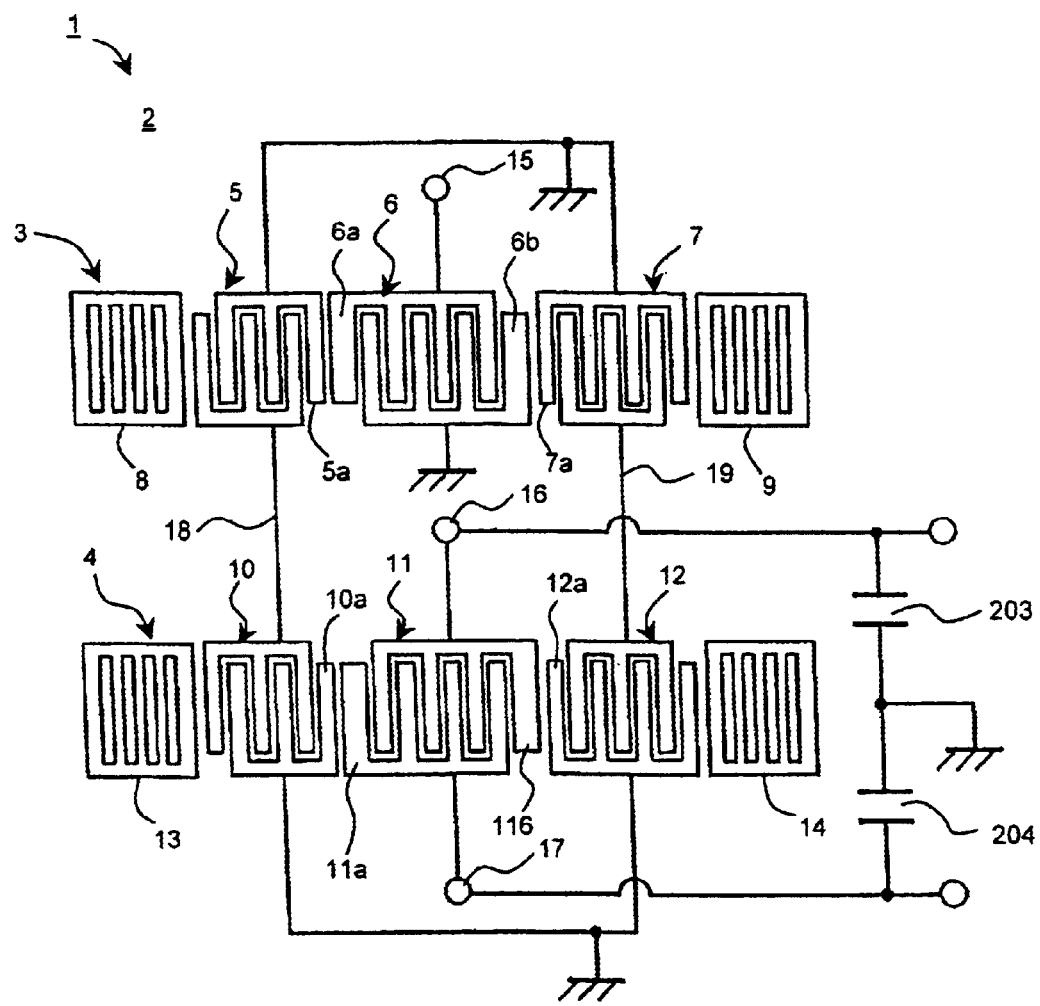
FIG. 26 is a schematic plan view illustrating a modification of the third preferred embodiment of the present invention.
Figure 27:
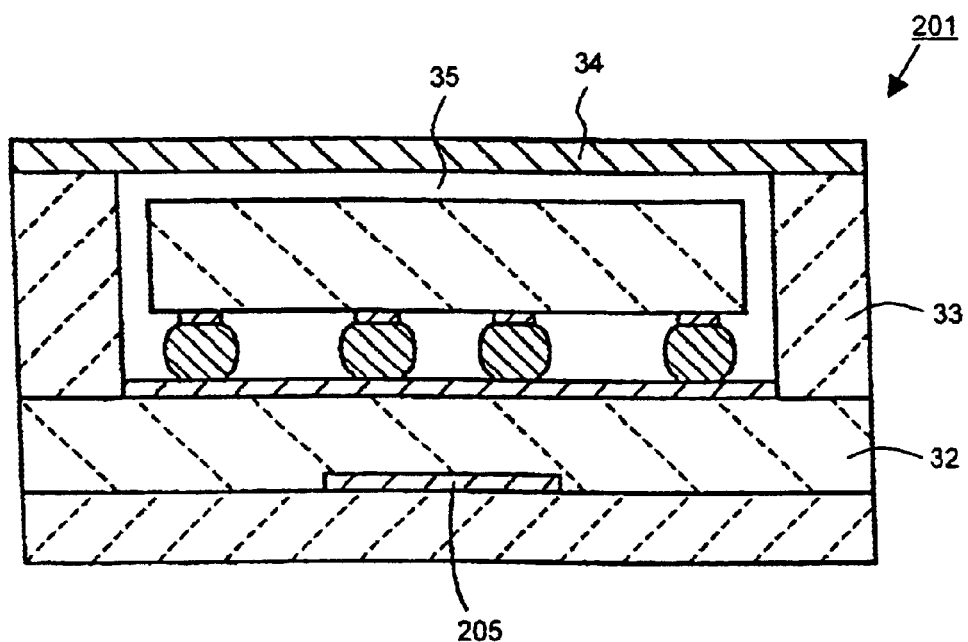
FIG. 27 is a schematic plan view illustrating a structure according to the modification of the third preferred embodiment of the present invention.

Alternatively, as shown in FIG. 26, capacitance components 203 and 204 may be connected between the pair of balance signal terminals via a ground potential, and the same effect can be obtained. More specifically, as shown in FIG. 27, an ground electrode 205 is provided in the package so as to be positioned below the balance signal terminals. In this way, the capacitance component can be increased between the balance signal terminals 16 and 17, thereby improving the balance of the surface acoustic wave device.

Figure 28:
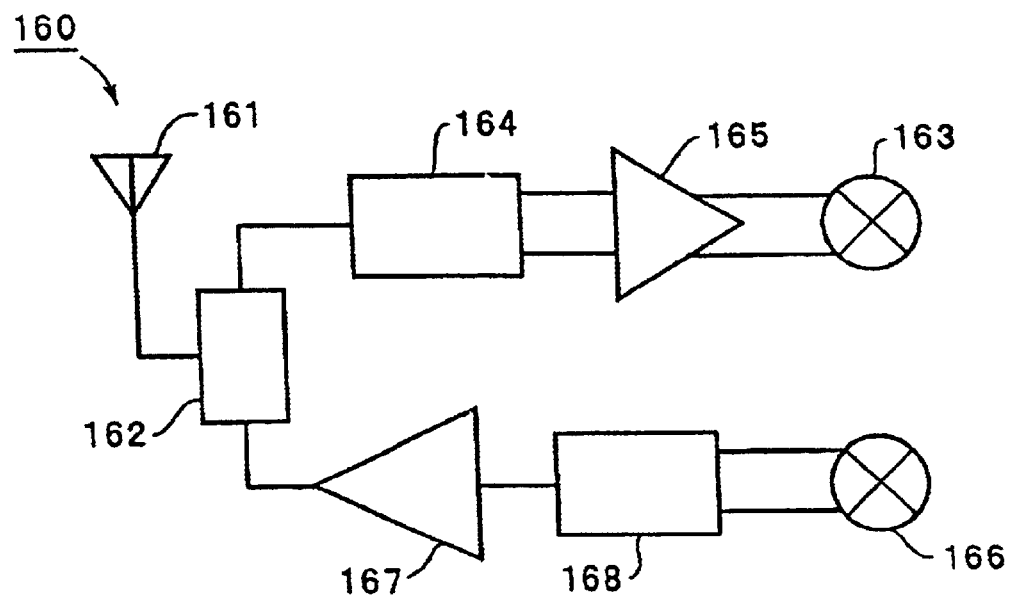
FIG. 28 is a schematic block diagram for describing a communication device in which a surface acoustic wave device according to various preferred embodiments of the present invention is used.
Figure 29:
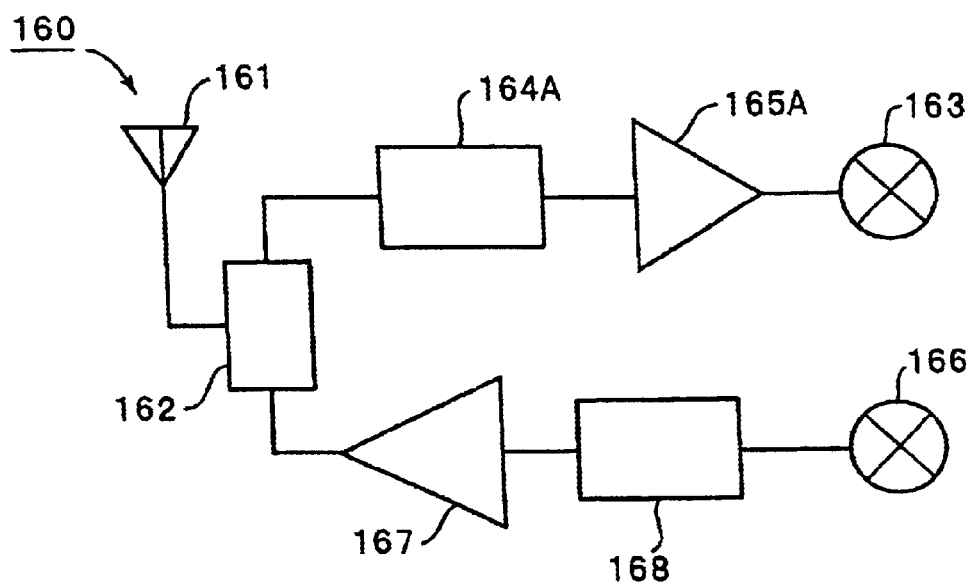
FIG. 29 is a schematic block diagram for describing another example of a communication device in which a surface acoustic wave device according to various preferred embodiments of the present invention is included.
Figure 30:
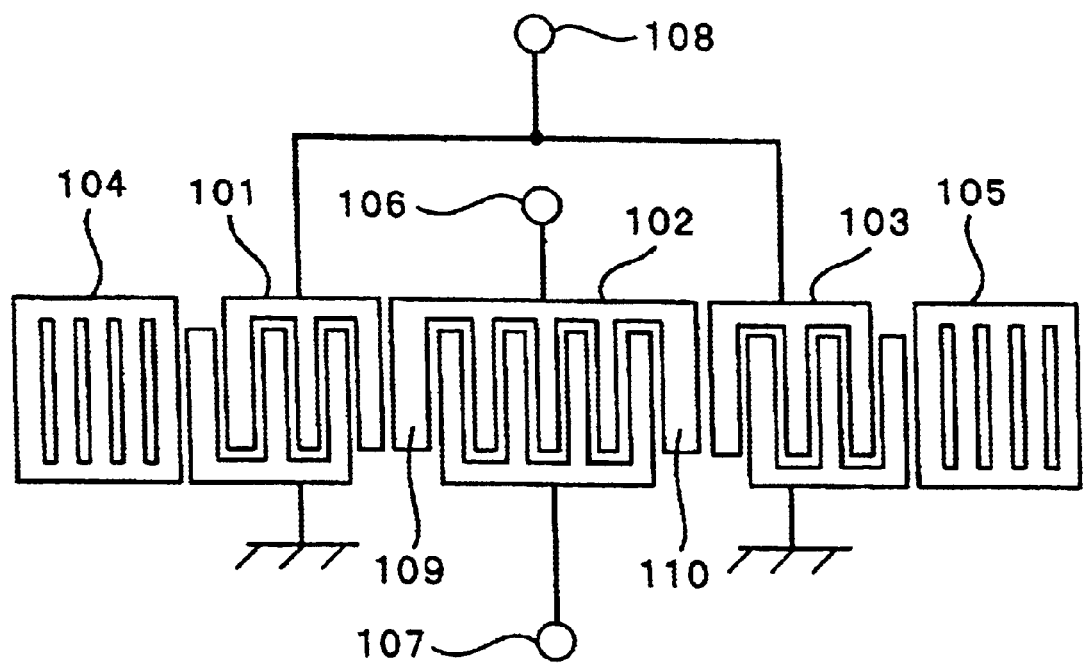
FIG. 30 is a schematic plan view for describing a conventional surface acoustic wave device.

FIGS. 28 and 29 are block schematic diagrams for describing a communication device 160 including a surface acoustic wave device according to a preferred embodiment of the present invention.

In FIG. 28, a duplexer 162 is connected to an antenna 161. A surface acoustic wave filter 164 and an amplifier 165 are connected between the duplexer 162 and a reception side mixer 163. Furthermore, an amplifier 167 and a surface acoustic wave filter 168 are connected between the duplexer 162 and a transmission side mixer 166. In this way, when the amplifier 165 can cope with a balanced signal, a surface acoustic wave device constructed according to other preferred embodiments of the present invention can be appropriately used as the above-mentioned surface acoustic wave filter 164.

Furthermore, as shown in FIG. 29, also when an amplifier 165A used on the reception side deals with an unbalanced signal, a surface acoustic wave device constructed according to preferred embodiments of the present invention can be appropriately used as a surface acoustic wave filter 164A.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a piezoelectric substrate;
   at least one IDT disposed on the piezoelectric substrate;
   an input end and an output end connected to the IDT, at least one of the input end and the output end including a pair of balanced signal terminals;
   at least one of a delay line and a reactance component connected to one of the pair of balanced signal terminals; and
   a package and a microstrip line provided on one of the package and the piezoelectric substrate, wherein the microstrip line constitutes at least one of the delay line and the reactance component.

2. A surface acoustic wave device according to claim 1, wherein the surface acoustic wave device is a longitudinally coupled resonator type surface acoustic wave filter in which at least three IDTs are disposed along the surface acoustic wave propagation direction.

3. A surface acoustic wave device according to claim 2, wherein the surface acoustic wave device includes a plurality of the longitudinally coupled resonator type surface acoustic wave fitters.

4. A surface acoustic wave device according to claim 1, wherein there is no electrically neutral point between the first and second balanced signal terminals.

5. A communication device containing a surface acoustic wave device according to claim 1.

6. A surface acoustic wave device according to claim 1, further comprising a plurality of IDTs disposed on the piezoelectric substrate and housed inside the package such that the surface of the piezoelectric substrate having the IDTs disposed thereon facing downward.

7. A surface acoustic wave device according to claim 1, wherein the package has electrodes disposed thereon;

the electrodes of the package are electrically connected to at least one of the input and output ends having the first and second balanced signal terminals via a bonding wire; and the bonding wire constitutes at least one of the delay line and the reactance component.

8. A surface acoustic wave device comprising:

a piezoelectric substrate;

at least one IDT disposed on the piezoelectric substrate;

an input end and an output end connected to the IDT, at least one of the input end and the output end including a pair of balanced signal terminals;

at least one of a plurality of delay lines and a plurality of reactance components connected to the pair of balanced signal terminals, respectively, and being different from each other; and a package and a microstrip line provided on one of the package and the piezoelectric substrate, wherein the microstrip line constitutes at least one of the delay line and the reactance component.

9. A communication device containing a surface acoustic wave device according to claim 8.

10. A surface acoustic wave device according to claim 8, wherein the surface acoustic wave device is a longitudinally coupled resonator type surface acoustic wave filter in which at least three IDTs are disposed along the surface acoustic wave propagation direction.

11. A surface acoustic wave device according to claim 10, wherein the surface acoustic wave device includes a plurality of the longitudinally coupled resonator type surface acoustic wave filters.

12. A surface acoustic wave device according to claim 8, wherein there is no electrically neutral point between the first and second balanced signal terminals.

13. A surface acoustic wave device according to claim 8, wherein the package has electrodes disposed thereon;

the electrodes of the package are electrically connected to at least one of the input and output ends having the first and second balanced signal terminals via a bonding wire; and wherein the bonding wire constitutes at least one of the delay line and the reactance component.

14. A surface acoustic wave device according to claim 8, further comprising a plurality of IDTs disposed on the piezoelectric substrate and housed inside the package such that the surface of the piezoelectric substrate having the IDTs disposed thereon facing downward.

15. A surface acoustic wave device comprising:

a piezoelectric substrate;

a plurality of IDTs disposed on the piezoelectric substrate forming a plurality of longitudinally coupled resonator type surface acoustic wave filters;

at least one of an input end of the surface acoustic wave device and an output end of the surface acoustic wave device includes a pair of balanced signal terminals; and a capacitance component connected between the pair of balanced signal terminals.

16. A surface acoustic wave device according to claim 15, further comprising a package and a microstrip line provided on one of the package and the piezoelectric substrate, wherein the microstrip line constitutes the capacitance component.

17. A surface acoustic wave device according to claim 16, further comprising a plurality of IDTs disposed on the piezoelectric substrate and housed inside the package such that the surface of the piezoelectric substrate having the IDTs disposed thereon facing downward.

18. A surface acoustic wave device according to claim 15, wherein at least one of the plurality of longitudinally coupled resonator type surface acoustic wave filters includes at least three IDTs disposed along the surface acoustic wave propagation direction.

19. A surface acoustic wave device according to claim 15, further comprising a package having electrodes disposed thereon, wherein the electrodes of the package are electrically connected to at least one of the input and output ends having the pair of balanced signal terminals via a bonding wire, and wherein the bonding wire is connected to the capacitance component.

20. A surface acoustic wave device according to claim 15, wherein there is no electrically neutral point between the pair of balanced signal terminals.

21. A communication device containing a surface acoustic wave device according to claim 15.

* * * * *